(12) United States Patent
Smith et al.

(10) Patent No.: US 7,271,905 B2
(45) Date of Patent: Sep. 18, 2007

(54) METHOD AND APPARATUS FOR SELF-REFERENCED WAFER STAGE POSITIONAL ERROR MAPPING

(75) Inventors: Adlai Smith, San Diego, CA (US);
Bruce McArthur, San Diego, CA (US);
Robert Hunter, Jr., San Diego, CA (US)

(73) Assignee: Litel Instruments, San Diego, CA (US)

( * ) Notice: Subject to any disclaimer, the term of this patent is extended or adjusted under 35 U.S.C. 154(b) by 0 days.

(21) Appl. No.: 10/775,718

(22) Filed: Feb. 9, 2004

(65) Prior Publication Data
US 2004/0162687 A1 Aug. 19, 2004

Related U.S. Application Data

(63) Continuation of application No. 09/891,699, filed on Jun. 26, 2001, now Pat. No. 6,734,971.

(60) Provisional application No. 60/254,413, filed on Dec. 8, 2000.

(51) Int. Cl.
*G01B 11/00* (2006.01)
(52) U.S. Cl. .................. 356/401
(58) Field of Classification Search ......... 356/400, 356/401; 355/53, 55; 430/22; 250/548
See application file for complete search history.

(56) References Cited

U.S. PATENT DOCUMENTS

| 4,757,207 A | 7/1988 | Chappelow et al. ..... 250/491.1 |
| 4,861,148 A | 8/1989 | Sato et al. ................. 350/505 |
| 4,929,083 A | 5/1990 | Brunner ..................... 356/123 |
| 5,056,921 A * | 10/1991 | Chaney ....................... 356/493 |
| 5,124,927 A | 6/1992 | Hopewell et al. ......... 250/491.1 |
| 5,262,257 A | 11/1993 | Fukuda et al. ............ 250/492.2 |
| 5,285,236 A | 2/1994 | Jain .............................. 355/53 |
| 5,438,413 A | 8/1995 | Mazor et al. ................ 356/363 |
| 5,444,538 A | 8/1995 | Pellegrini ................... 356/401 |
| 5,477,058 A | 12/1995 | Sato .......................... 250/548 |
| 5,700,602 A | 12/1997 | Dao et al. ..................... 430/22 |
| 5,757,507 A | 5/1998 | Ausschnitt et al. ......... 356/401 |
| 5,805,290 A | 9/1998 | Ausschnitt et al. ......... 256/401 |
| 5,824,441 A | 10/1998 | Farrow et al. ................ 430/22 |
| 5,877,861 A | 3/1999 | Ausschnitt et al. ......... 356/401 |
| 5,953,128 A | 9/1999 | Ausschnitt et al. ......... 250/548 |
| 6,023,338 A | 2/2000 | Bareket ....................... 356/401 |
| 6,064,486 A | 5/2000 | Chen et al. .................. 356/399 |
| 6,079,256 A | 6/2000 | Bareket ........................ 73/105 |
| 6,130,750 A | 10/2000 | Ausschnitt et al. ......... 356/401 |

(Continued)

OTHER PUBLICATIONS

Armitage Jr., J.D. and Kirk, J.P., "Analysis of overlay distortion patterns", *SPIE*, 921:207-222, (1988).

(Continued)

*Primary Examiner*—Michael G. Lee
*Assistant Examiner*—Kumiko C. Koyama

(57) ABSTRACT

A wafer stage overlay error map is created using standard overlay targets and a special numerical algorithm. A reticle including a 2-dimensional array of standard overlay targets is exposed several times onto a photoresist coated silicon wafer using a photolithographic exposure tool. After exposure, the overlay targets are measured for placement error using a conventional overlay metrology tool. The resulting overlay error data is then supplied to a software program that generates a 2-dimensional wafer stage distortion and yaw overlay error map.

5 Claims, 23 Drawing Sheets

U.S. PATENT DOCUMENTS

| | | | | |
|---|---|---|---|---|
| 6,137,578 | A | 10/2000 | Ausschnitt | 356/399 |
| 6,142,641 | A | 11/2000 | Cohen et al. | 359/731 |
| 6,143,621 | A | 11/2000 | Tzeng et al. | 438/401 |
| 6,153,886 | A | 11/2000 | Hagiwara et al. | 250/548 |
| 6,163,366 | A | 12/2000 | Okamoto et al. | 355/53 |
| 6,204,912 | B1 | 3/2001 | Tsuchiya et al. | 355/53 |
| 6,218,200 | B1 | 4/2001 | Chen et al. | 356/399 |
| 6,269,322 | B1* | 7/2001 | Templeton et al. | 702/150 |
| 6,417,929 | B1 | 7/2002 | Ausschnitt et al. | 56/634 |

OTHER PUBLICATIONS

Biesterbos et al., "A new lens for aubmircron lithography and its consequences for wafer stepper design", *SPIE*, 633:34-43, (1986).

Bjorkholm et al., "Reduction imaging at 14 nm using multilayer-coated optics: printing of features smaller than 0.1 µm", *J. Vac. Sci. Technol.B.*, 8(6):1509-1543, (1990).

Bruning et al., "Optical Lithography—Thirty years and three orders of magnitude", *SPIE*, 3051:14-27, (1997).

Cote et al., "Micrascan™ III-performance of a third generation, catadioptric step and scan lithographic tool", *SPIE*, 3051:806-816, (1997).

DeJule, R., "Mix-and Match: A Necessary Choice", *Semiconductor International*, 23(2): 66-76, (Feb. 2000).

Dooly, T. and Yang, Y., "Stepper matching for optimum line performance", *SPIE*, 3051:426-432, (1997).

Goodwin, F. and Pellegrini, J.C., "Characterizing Overlay Registration of Concentric 5X and 1X Stepper Exposure Fields using Interfield Data", *SPIE*, 3050:407-417, (1997).

Goodwin, F., "Expanding capabilities in existing fabs with lithography tool-matching", *Solid State Technology*, 97-106, (Jun. 2000).

*Handbook of Microlithography, Micromaching, and Microfabrication*, Book: vol. 1, "Microlithography", Rai-Choudhury, P. (Ed.), SPIE Optical Engineering Press, SPIE, Bellingham, Washington, pp. 417-418, (1997).

Hasan et al., "Automated Electrical Measurements of Registration Errors in Step-and-Repeat optical Lithography Systems", *IEEE Transactions of Electron Devices*, ED27(12):2304-2312, (1980).

Kenp et al., "A "golden standard" wafer design for optical stepper characterization", *SPIE*, 1464:260-266, (1991).

KLA 5105, "Linewidth and Misregistration System", KLA 5105 Product Specifications, *KLA Instruments Corporation*, 2 pages, (1995).

Kodama, K. and Matsubara, E., "Measuring system XY-5i", *SPIE*, 2439:144-155, (1995).

Leica LMS IPRO, "Fully automated mask and wafer metrology system", *Leica*, pamphlet pp. 1-5.

Lin, B.J., "The Attenuated Phase-Shifting Mask", *Solid State Technology*, Special Series/Advanced Lithography, 35(1):43-47, (Jan. 1992).

Martin et al., "Measuring Fab Overlay Programs", *SPIE*, 3677:64-71(1999).

Mc Fadden, E.A. and Ausschnitt, C.P., "A Computer Aided Engineering Workstation For Registration Control", *SPIE*, 1087:255-266, (1989).

Mulkens et al., "ArF Step And Scan Exposure System For 0.15 µm Technology Node?", *SPIE*, 3679:506-521, (1999).

Müller et al., "Large Area Fine Line Patterning By Scanning Projection Lithoghrapy", *MCM proceedings*, pp. 100-104, (1994).

Newnam, B.E. and Viswanathan, V.K., "Development of XUV projection lithograph at 60-80 nm", *SPIE*, 1671:419-436, (1992).

Nikon Lithography Tool Brochures (Japanese Nikon).

*Numerical Recipes*, "The Art of Scientific Computing", Press et al. (Eds.), Cambridge University Press, New York, pp. 52-64 (1990).

Pellegrini, J.C., "Comparisons of Six Different Intrafield Control Paradigms in an Advanced Mix-and-Match Environment", *SPIE*, 3050:398-406, (1997).

Pellegrini et al., "Super Sparse Overlay Sampling Plans: An Evaluation of Methods and Algorithms for Optimizing Overlay Quality Control and Metrology Tool Throughput", *SPIE*, 3677:72-82, (1999).

Preil, M.E. and McCormack, J.F.M., "A New Approach to Correlating Overlay and Yield", *SPIE*, 3677:208-216, (1999).

Progler et al., "Method to Budget and Optimize Total Device Overlay", *SPIE*, 3679:193-207, (1999).

Quaestro Q7, "Fully Automated Optical Metrology System for Advanced IC Production", Quaestor Q7 Product Specification, *BIO -RAD*, 2 pages.

Raugh, M.R., "Error estimation for lattice methods of stage self-calibration", *SPIE*, 3050:614-625, (1997).

Starikov et al., "Accuracy of overlay measurements: tools and mark asymmetry effects", *Optical Engineering*, 31(6):1298-1310, (1992).

Sullivan, N.T., "Semiconductor Pattern Overlay", *SPIE Critical Reviews of Optical Science and Technology*, CR52:160-188, (1994).

Takac et al., "Self-calibration in two-dimensions: the experiment", *SPIE*, 2725:130-146, (1996).

v.d. Brink et al., "Direct-referencing automatic two-points reticle-to-wafer alignment using a projection column servo system", *SPIE*, 633:60-71, (1986).

van den Brink et al., "Matching Management of Multiple Wafer Steppers Using a Stable Standard And A Matching Simulator", *SPIE*, 1087:218-232, (1989).

van den Brink et al., "Matching Of Mulitple Wafer Steppers For 0.35 µm Lithography Using Advanced Optimization Schemes", *SPIE*, 1926:188-207, (1993).

van den Brink et al., "Matching Performance For Multiple Wafer Steppers Using An Advanced Metrology Procedure", *SPIE*, 921:180-197, (1988).

van den Brink et al., "New 0.54 Aperture i-Line Wafer Stepper With Field By Field Leveling Combined With Global Alignment", *SPIE*, 1463:709-724, (1991).

van den Brink et al., "Step-And-Scan And Step-And-Repeat, A Technology Comparison", *SPIE*, 2726:734-753, (1996).

van Schoot et al., "0.7 NA DUV Step & Scan System For 150nm Imaging With Improved Overlay", *SPIE*, 3679:448-463, (1999).

Yost, A. and Wu, W., "Lens matching and distortion testing in a multi-stepper, sub-micron environment", *SPIE*, 1087:233-244, (1989).

Zavecz et al., "Life Beyond Mix-and-Match: Controlling Sub-0.18 µm Overlay Errors", *Semiconductor International*, 23(8):205,206,208,210,212 and 214, (Jul. 2000).

Zavecz, T.E., "Machine Models and Registration", *SPIE Critical Reviews of Optical Science and Technology*, CR52:134-159 (1994).

\* cited by examiner

OVERLAPPING TARGETS um = microns, Dark = unexposed, white = exposed.

um = microns, Dark = chrome, white = clear.

FIG. 9
um = microns, Dark = unexposed, white = exposed.
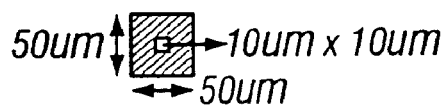
FIG. 10A
um = microns, Dark = chrome, white = clear.
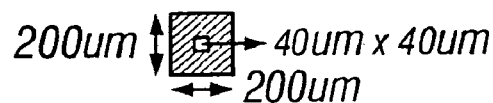
FIG. 10B
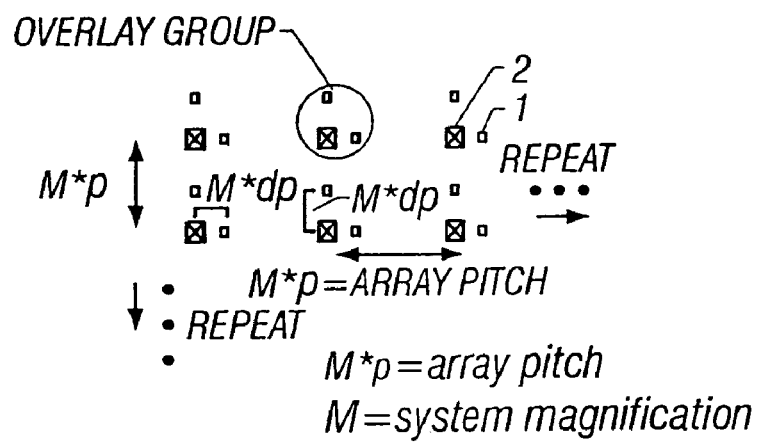
$M*p$ = array pitch
$M$ = system magnification
FIG. 11

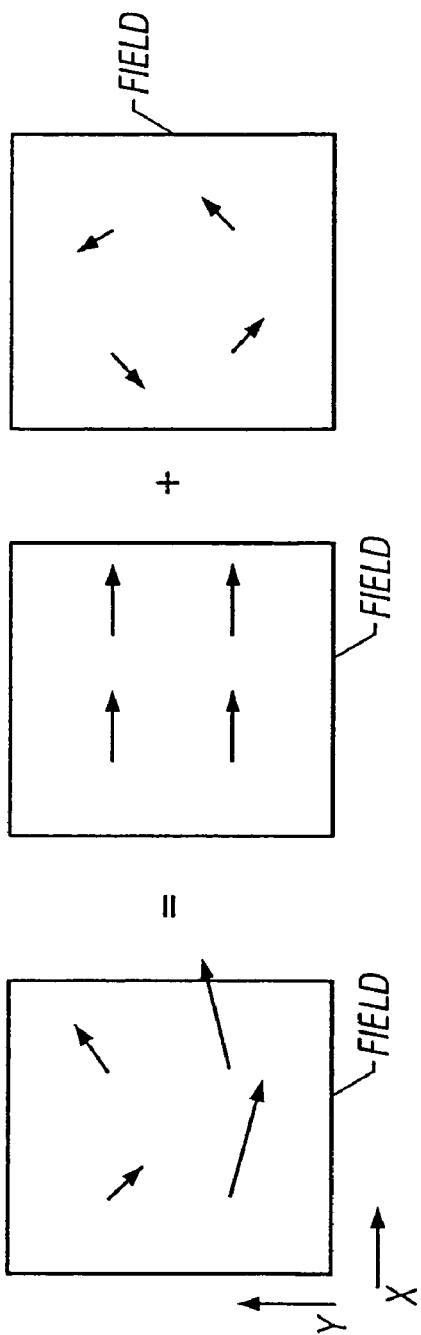
FIG. 27  FIG. 28  FIG. 29
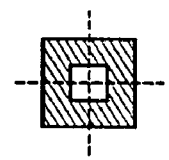
FIG. 30
*THE VECTOR REPRESENTS THE ALIGNMENT OFFSET DISTANCE BETWEEN THE BOX-IN-BOX STRUCTURE*
FIG. 31

Dark=chrome, white=clear.

Dark=chrome, white=clear.

*Length units = microns,*
*Yaw units = microradians,*
*xG, yG = nominal field center position.*
*dxG, dyG = offset of center of field.*
*Qg = yaw of field.*
*Fx, Fy = field stepping distance,*
*srel = grid scale - intra-field scale (parts per million),*
*D = wafer diameter.*

```
machine id: DUVX5J
D           :200000.000
Fx          : 20000.000
Fy          : 20000.000
srel        :    -39.455
       xG              yG             dxG           dyG            Qg
-100000.000          0.000          -0.139         0.044         10.3
 -80000.000          0.000           0.223        -0.233         94.0
 -60000.000          0.000           0.498         0.004        -34.7
      .                .                .             .             .
      .                .                .             .             .
      .                .                .             .             .
  60000.000      40000.000            0.099        -0.188         59.2
```

*FIG. 46*

METHOD AND APPARATUS FOR SELF-REFERENCED WAFER STAGE POSITIONAL ERROR MAPPING

CROSS REFERENCE TO RELATED APPLICATIONS

The present application is a continuation of U.S. application Ser. No. 09/891,699 filed Jun. 26, 2001 now U.S. Pat. No. 6,734,971, entitled "Method and Apparatus for Self-Referenced Wafer Stage Positional Error Mapping", by Adlai Smith, Bruce McArthur, and Robert Hunter, Jr., which claims priority to U.S. Provisional Application Ser. No. 60/254,413 filed Dec. 8, 2000 entitled "Method and Apparatus for Self-Referenced Wafer Stage Positional Error Mapping", by Adlai Smith, Bruce McArthur, and Robert Hunter, Jr. These applications are incorporated by reference in their entirety herein.

BACKGROUND OF THE INVENTION

1. Field of the Invention

The present invention relates generally to manufacturing processes requiring lithography and more particularly to characterizing and monitoring the inter-field errors of semiconductor wafer stages.

2. Description of the Related Art

Today's lithographic processing requires ever tighter layer-to-layer overlay tolerances to meet device performance requirements. Overlay registration is defined as the translational error that exists between features exposed layer to layer in the vertical fabrication process of semiconductor devices on silicon wafers. Other names for overlay registration include, registration error and pattern placement error, and overlay error. Overlay registration on critical layers can directly impact device performance, yield and repeatability. Increasing device densities, decreasing device feature sizes and greater overall device size conspire to make pattern overlay one of the most important performance issues during the semiconductor manufacturing process. The ability to accurately determine correctable and uncorrectable pattern placement error depends on the fundamental techniques and algorithms used to calculate lens distortion, stage error, and reticle error.

A typical microelectronic device or circuit may consist of 20-30 levels or pattern layers. The placement of pattern features on a given level must match the placement of corresponding features on other levels, i.e. overlap, within an accuracy which is some fraction of the minimum feature size or critical dimension (CD). Overlay error is typically, although not exclusively, measured with an optical overlay metrology tool. See Semiconductor Pattern Overlay, N. Sullivan, SPIE Critical Reviews Vol. CR52, 160:188; Accuracy of Overlay Measurements: Tool and Mark Asymmetry Effects, A. Starikov, et. al., Optical Engineering, 1298:1309, 1992.

Lithographers have crafted a variety of analysis techniques that attempt to separate out systematic process induced overlay error from random process induced error using a variety of statistical methods. See A Computer Aided Engineering Workstation for Registration Control, E. McFadden, C. Ausschnitt, SPIE Vol. 1087, 255:266, 1989; A "Golden Standard" Wafer Design for Optical Stepper Characterization, K. Kenp, C., King, W. W., C. Stager, SPIE Vol. 1464, 260:266, 1991; Matching Performance for Multiple Wafer Steppers Using an Advanced Metrology Procedure, M. Van den Brink, et. al., SPIE Vol. 921, 180:197, 1988; Characterizing Overlay Registration of Concentric 5× and 1× Stepper Exposure Fields Using Interfield Data, F. Goodwin, J. Pellegrini, SPIE Vo. 3050, 407:417, 1997; Super Sparse Overlay Sampling Plans: An Evaluation of Methods and Algorithms for Optimizing Overlay Quality Control and Metrology tool Throughout, J. Pellegrini, SPIE Vol. 3677, 72:82, 36220. The importance of overlay error and its impact to yield can be found elsewhere. See Measuring Fab Overlay Programs, R. Martin, X. Chen, I. Goldberger, SPIE Conference Metrology, Inspection, and Process Control for Microlithography XIII, 64:71, March, 1999; A New Approach to Correlating Overlay and Yield, M. Preil, J. McCormack, SPIE Conference on Metrology, Inspection, and Process Control for Microlithography XIII, 208:216, March, 1999. Lithographers have created statistical computer algorithms (for example, Klass II. See Lens Matching and Distortion testing in a multistepper, sub-micron environment, A. Yost, et al., SPIE Vol. 1087, 233:244, 1989 and Monolith; A Computer Aided Engineering Workstation for Registration Control, supra) that attempt to separate out correctable sources of pattern placement error from non-correctable sources of error. See Analysis of Overlay Distortion Patterns, J. Armitage, J. Kirk, SPIE Vol. 921, 207:221, 1988; Method to Budget and Optimize Total Device Overlay, C. Progler, et al., SPIE Vol. 3679, 193:207, 1999 and U.S. Pat. No. 5,444,538, entitled System and Method for Optimizing the Grid and Intrafield Registration of Wafer Patterns, J. Pellegrini, Aug. 22, 1995. Overall theoretical reviews of overlay modeling can be found in Semiconductor Pattern Overlay, N. Sullivan, SPIE Critical Reviews Vol. CR52, 160:188 and Machine Models and Registration, T. Zavecz, SPIE Critical Reviews Vol. CR52, 134:159.

The effects of overlay error are typically divided into the following two major categories for the purpose of quantifying overlay error and making precise exposure adjustments to correct the problem. The first category, grid or inter-field error, is the positional shift and rotation or yaw of each exposure pattern, exposure field, or simply field, with reference to the nominal center position of the wafer 2001 and 2010 in FIGS. 20A and 20B, respectively.

Referring to FIG. 20A, the intra-field error in field placement on the wafer is shown as a vector offset 2002 for each field. This vector offset is the difference in the placement of the field center from its ideal or nominal position and actual position, and represents one of the components of the inter-field error, that the present invention will determine. FIG. 20B shows the other part of intra-field error, which is the yaw or rotational error in the placement of the individual fields, that is also determined by this technique.

Overlay modeling algorithms typically divide grid or inter-field error into sub-categories or components, the first five of which are translation, rotation, magnification or scale, non-orthogonality, and stage distortion. See Matching Performance for Multiple Wafer Steppers Using an Advanced Metrology Procedure, supra. The following discussion is concerned with wafer stage distortion and yaw induced registration or overlay error; these global or inter-field positional errors may be caused by the wafer stage subsystem of the stepper.

The second category, intra-field overlay error, is the positional offset of an individual point inside a projected field referenced to the nominal center of an individual exposure field, as illustrated in FIG. 20A. Here the term "nominal center" means the exact location of the center of a perfectly aligned exposure field. FIG. 20A schematically shows intra-field overlay error as a set of vector displacements within the exposure field, each vector representing the magnitude and direction of the placement error. The following four main components each named for a particular effect are typically used to describe the sources of intra-field error: translation, rotation, scale or magnification, and lens distortion.

Intra-field overlay errors are typically related to lens aberrations and reticle alignment. Separation of the overlay error into inter-field and intra-field components is based on the physically distinguishable sources of these errors, lens aberrations or reticle positioning for intra-field and the wafer stage for inter-field.

It is important for this discussion to realize that most overlay measurements are made on silicon product wafers after each lithographic process, prior to final etch. Product wafers cannot be etched until the alignment attributes or overlay target patterns are properly aligned to the underlying overlay target patterns. There are many types of alignment attributes or overlay target patterns, some of which are shown in FIG. 1. Others are shown in U.S. Pat. No. 6,079,256 entitled Overlay Alignment Measurement of Wafers, N. Bareket, Jun. 27, 2000 (see FIG. 1b); Matching Management of Multiple Wafer Steppers Using a Stable Standard and a Matching Simulator, M. Van den Brink, et al., SPIE Vol. 1087, 218:232, 1989; Automated Electrical Measurements of Registration Errors in Step and Repeat Optical Lithography Systems, T. Hasan, et al., IEEE Transactions on Electron Devices, Vol. ED-27, No. 12, 2304:2312, December 1989; U.S. Pat. No. 5,757,507 entitled Method of Measuring Bias and Edge Overlay Error for Sub 0.5 Micron Ground Rules, C. Ausschnitt et al., May 26, 1998; U.S. Pat. No. 6,143,621 entitled Capacitor Circuit Structure for Determining Overlay Error, K. Tzeng, et al., Nov. 7, 2000. Manufacturing facilities rely heavily on exposure tool alignment, wafer stage matching and calibration procedures. See Stepper Matching for Optimum Line Performance, T. Dooley, Y. Yang, SPIE Vol. 3051, 426:432, 1997; Matching Management of Multiple Wafer Steppers Using a Stable Standard and a Matching Simulator, supra; Matching Performance for Multiple Wafer Steppers Using an Advanced Metrology Procedure, supra, to help insure that the stepper or scanner tools are aligning properly; inaccurate overlay modeling algorithms can corrupt the exposure tool calibration procedures and degrade the alignment accuracy of the exposure tool system. See Characterizing Overlay Registration of Concentric 5× and 1× Stepper Exposure Fields Using Interfield Data, supra.

Over the past 30 years the microelectronics industry has experienced dramatic rapid decreases in critical dimension by constantly improving lithographic imaging systems. See A New Lens for Submicron Lithography and its Consequences for Wafer Stepper Design, J. Biesterbos, et al., SPIE Vol. 633, Optical Microlithography V, 34:43, 1986; New o.54 Aperature I-Line Wafer Stepper With Field by Field Leveling Combined with Global Alignment, M. Van den Brink, B. Katz, S. Wittekoek, SPIE Vol. 1463, 709:724, 1991; Step and Scan and Step and Repeat, a Technology Comparison, M. Van den Brink, et al., SPIE Vol. 2726, 734:753; 0.7 NA DUV Step and Scan system for 150 nm Imaging with Improved Overlay, J. V. Schoot, SPIE Vol. 3679, 448:463, 1999.

Today, these photolithographic exposure tools or machines are pushed to performance limits. As the critical dimensions of semiconductor devices approach 50 nm, the overlay error requirements will soon approach atomic dimensions. See Life Beyond Mix-and-Match: Controlling Sub-0.18 micron Overlay Errors, T. Zavecz, Semiconductor International, July 2000. To meet the needs of next generation device specifications new overlay methodologies need to be developed. In particular, overlay methodologies that can accurately separate out systematic and random effects and break them into assignable cause will greatly improve device process yields. See A New Approach to Correlating Overlay and Yield, supra; Expanding Capabilities in Existing Fabs with Lithography Tool-matching, F. Goodwin et al., Solid State Technology, 97:106, June 2000; Super Sparse overlay sampling plans: An Evaluation of Methods and Algorithms for Optimizing Overlay Quality Control and Metrology Tool Throughput, supra; Lens Matching and Distortion Testing in a Multi-Stepper, Sub-Micron Environment, J. V. Schoot, SPIE Vol. 3679, 448:463; 1999; ArF Step And Scan Exposure System For 0.15 Micron and 0.13 micron Technology Node, J. Mulkens et al., SPIE Conference on Optical Microlithography XII, 506:521, March 1999. In particular, new overlay methodologies that can be implemented into advanced process control or automated control loops will be most important. See Comparisons of Six Different Intra-field Control Paradigms in an Advanced Mix and Match Environment, J. Pellegrini, SPIE Vol. 3050, 398:406, 1997; Characterizing Overlay Registration of Concentric 5× and 1× Stepper Exposure Fields Using Interfield Data, supra, U.S. Pat. No. 5,877,861 entitled Method for Overlay Control System, Auschnitt et al., Mar. 2, 1999. Finally, another area where quantifying intra-field error is of vital concern is in the production of photomasks or reticles during the electron beam manufacturing process. See Handbook of Microlithography and Microfabrication Vol. 1 P. Rai-Choudhury 1997 pg. 417.

Several common procedures are used to determine the relative magnitude of wafer stage placement error, semi-independent of other sources of registration or overlay error. Semiconductor manufacturing facilities use the resulting placement error information to manually or automatically adjust the wafer stage and stepper alignment system in such a way as to minimize the impact of overlay error. The technique has been simplified for illustration. See Matching Management of Multiple Wafer Steppers Using a Stable Standard and a Matching Simulator, supra; Matching Performance for Multiple Wafer Steppers Using an Advanced Metrology Procedure, supra. FIG. 3 shows a typical set of geometrically placed overlay target patterns consisting of a matching pair of male 302 and female 304 targets. The male 302 and female 304 targets are regularly spaced across a wafer stage test reticle 306 as shown in FIG. 3. It should be noted that the chrome target patterns on most reticles are 4 or 5 times larger as compared with the patterns they produce at the image plane; this simply means modern steppers or projection lithography tools are reduction systems. First, a photoresist coated wafer is loaded onto an exposure tool or stepper wafer stage and globally aligned. Next, the full-field image of the wafer stage test reticle is exposed several times at various positions across the surface of the photoresist coated wafer, see FIG. 22. In addition, several wafer alignment marks are also printed across the wafer using the wafer stage test reticle as shown in FIGS. 3 and 22. For purposes of illustration, we assume that the full-field of the wafer stage test reticle consists of an 11-by-11 array of male and female target pairs (separation d*M) evenly spaced at pitch p'*M, across the reticle surface, see FIGS. 3 and 5. The pattern is then sent through the remaining portions of the lithographic patterning process to delineate the resist pattern.

Depending on the technique used for stage matching, the resulting pattern can be permanently etched into a thin film or substrate if so desired. The final sequence of stage matching involves transferring the patterned wafer and wafer stage test reticle into a different exposure tool or stepper and recording alignment coordinates in the following way. The patterned wafer is globally and finely aligned into position using the previously placed wafer alignment marks, as shown in FIG. 22. Next, the wafer stage is moved around in such a way as to align the wafer stage test reticle containing an 11-by-11 array of male targets directly on a field exposure pattern (or field) containing an 11-by-11 array of female target patterns, see FIGS. 4 and 22. This involves shifting the wafer the small increment d, illustrated in FIGS. 5 and 6, so male and female targets lie on top of one another, as shown in FIG. 4.

When the stepper has finished the alignment procedure, the x, y wafer stage coordinates and overlay error associated with several male-female target pairs are electronically recorded. This step, align, and record procedure is repeated across the entire wafer for each exposure field containing the 11-by-11 target array, illustrated in FIGS. 23 and 24. The electronically recorded target coordinates and overlay errors are then entered into a statistical modeling algorithm that calculates the components of inter-field and intra-field overlay error.

An important point is that the resulting inter-field or wafer stage overlay error does not yield the unique overlay error of the wafer stage in question; instead, it only can be used to report the inter-field or wafer stage overlay error as referenced to another machine stage, sometimes called a "mother" or "reference machine". In general, semiconductor manufacturers rely on some kind of stage matching or cross-referencing technique to calculate the relative wafer stage overlay error.

There are several problems associated with this technique. First, as noted above, the technique does not yield the unique wafer stage overlay error; it only provides a relative measure of all components. To obtain the relative stage error between two machines, the inter-field errors so determined must be subtracted from one another, which results in increasing the noise in the determination of stage error. In some cases semiconductor manufacturing facilities (fabs) produce a special "golden" reference wafer that can be used for comparison purposes.

Second, the models used to calculate the systematic inter-field error usually do not account for the stage error associated with distortion and yaw. They are typically limited to translation, rotation, orthogonality and x and y scale errors. See A Computer Aided Engineering Workstation for Registration Control, supra. Higher order errors are ignored or otherwise not taken into account. By relying on wafers created on a reference machine, these wafers are not identical or have unknown overlay deviations from one. another since they must be exposed on a single machine in a short time to minimize machine instabilities. See Matching Management of Multiple Wafer Steppers Using a Stable Standard and a Matching Simulator, supra. It would be very desirable to have an inter-field overlay technique that would calculate the wafer stage component of overlay error independently from a reference exposure tool or golden wafer without the need for matching to another machine's stage. See Mix-And-Match: A necessary Choice, R. DeJule, Semiconductor International, 66:76, February 2000.

Another technique (See Matching Performance for Multiple Wafer Steppers Using an Advanced Metrology Procedure, supra; Expanding Capabilities in Existing Fabs with Lithography Tool-matching, supra) utilizes a reference machine (projection imaging tool) for measurement of inter-field overlay error. The reference machine is typically one that is closest to the average of all machines in the factory (See Expanding Capabilities in Existing Fabs with Lithography Tool-Matching, supra) or a machine that exhibits long term stability. See Matching Performance for Multiple Wafer Steppers Using an Advanced Metrology Procedure, supra. On the reference machine, a reference wafer is exposed, developed and etched. The reference wafer is exposed using an inner box reticle, 3302 in FIG. 33, that contains a regular array of inner box structures 3304 in a regular pattern covering the wafer. A 3×3 array is shown in FIG. 34.

Next, wafer alignment marks 3202 are exposed using a designated portion of the inner box reticle or a separate reticle containing the wafer alignment mark, as shown in FIG. 32. The reference wafer is then typically etched and stripped to produce pits 3502 in FIG. 35, corresponding to the inner box locations. A number of such wafers are produced and the locations of the inner box arrays (individual printings of the inner box reticle) then represent the inter-field positions of the reference machine.

Next, a reticle containing outer box structures, 3602 in FIG. 36 and detailed in FIG. 37, in the same nominal positions as the inner box reticle (or the pattern required to produce a completed, machine readable alignment attribute), is placed on the machine to be measured. A completed reference wafer shown in FIG. 34 is coated with photoresist, exposed and developed. The result is a developed reference wafer illustrated in FIG. 38 and detailed in FIG. 39, containing box-in-box structures that can then be measured on an overlay metrology tool. The resulting measurements are then typically averaged over each field in FIG. 38, and the twenty-five measurements within each field are averaged together to produce a net translation (Dxg, Dyg) and rotation (Yawg) for each of the nine fields. This averaged data is then fit to the following set of equations. See Matching of Multiple Wafer Steppers for 0.35 micron Lithography Using Advanced Optimization Schemes, M. Van den Brink, et al. SPIE Vol. 1926, 188:207, 1993; Matching Performance for Multiple Wafer Steppers Using an Advanced Metrology Procedure, supra:

$$Dxg=Txg+sxg*xg+(-qg+qog)*yg+D2x*yg^2+Rwx \quad (eq\ 3)$$

$$Dyg=Tyg+syg*yg+qg*yg+D2y*xg^2+Rwy \quad (eq\ 4)$$

$$Yawg=Qg+syawg*yg-2*D2y*xg+RwY \quad (eq\ 5)$$

Where:
Dxg, Dyg, Yawg=x,y,yaw grid errors at grid position xg, yg
xg, yg=grid position=position on wafer of field center with respect to the center of stage travel
Txg, Tyg=x,y grid translation
sxg, syg=x,y grid scale or magnification error
qg, qog=grid rotation, orthogonality
D2x, D2y=x,y stage bow terms
Rwx, Rwy, RwY=grid residual in the x, y, Yaw direction (we do not try fitting to these parameters).

The yaw error (Yawg) is the deviation of the rotation of the grid at a specific point. It results in a difference in field to field rotation as a function of placement position (xg, yg) on the wafer. The 10 unknown parameters (Txg, Tyg, . . . D2x, D2y) in equations 3,4,5 are solved for using standard least squares techniques. See Numerical Recipes, The Art of Scientific Computing, W. Press, et al., Cambridge University Press, 509:520, 1990.

Problems with this technique are: the systematic (repeatable) and random grid errors on the reference machine (the machine used for creating the reference wafers) are permanently recorded as half (inner or outer box) of our factory wide metrology standard. The magnitude and distribution of these errors is entirely unknown. For machine to machine comparisons of grid errors, the systematic or repeatable parts of the errors cancel out, but the influence of the random or non-repeatable error remains. This is why multiple reference wafers are typically used to improve machine to machine matching results. See Matching Management of Multiple Wafer Steppers Using a Stable Standard and a Matching Simulator, supra. Furthermore, reference machine instabilities over time lead to a drift or error in the factory wide standard represented by the reference machine. Yet another problem with this technique is that because it utilizes full size projected fields to determine the inter-field errors, it does not work with partially exposed fields as illustrated in FIG. 44. The ability to include partially exposed fields is important since product wafers typically contain multiple die within an exposure field, and therefore the inter-field error of partially exposed fields is important since it directly affects the edge die overlay error.

Another technique for grid error determination utilizing self-calibration is discussed in See Self-calibration in Two-Dimensions: The Experiment, M. Takac, J. Ye, M. Raugh, R. Pease, C. Berglund, G. Owen, SPIE Vol. 2725, 130:146, 1996; Error Estimation for Lattice Methods of Stage Self-calibration, M. Raugh, SPIE. Vol. 3050, 614:625, 1997. It consists of placing a plate (artifact) with a rectangular array of measurable targets on a tool stage and measuring the absolute positions of the targets using the tool's stage and the tool's image acquisition or alignment system. This measurement process is repeated by reinserting the artifact on the stage but shifted by one target spacing in the X direction, then repeated again with the artifact inserted on the stage shifted by one target spacing in the Y direction. Finally, the artifact is inserted at 90 degrees relative to its initial orientation and the target positions measured. The resulting tool measurements are a set of (x, y) absolute positions in the tool's nominal coordinate system.

Using the technique described in Self-calibration in Two-Dimensions: The Experiment, supra; and Error Estimation for Lattice Methods of Stage Self-calibration, supra, the absolute position of both targets on the artifact and a mixture of the repeatable and non-repeatable parts of the stage x,y grid error are then determined to within a global translation (Txg, Tyg), rotation (qg) and overall scale ((sxg+syg)/2) factor. Unfortunately, this technique cannot be applied to photolithographic exposure tools (machines) since the wafer position (artifact) typically cannot be placed on the wafer chuck in a position significantly (>=1 mm) shifted from the nominal position. In some machines, such a shift may be possible with extraordinary effort on the part of the maintenance engineer, but such a procedure is completely unsuitable in ordinary production use. Wafers (artifacts) can typically be automatically reinserted on the wafer chuck rotated 90 degrees from nominal, but without the additional X or Y shifts described above, the resulting reconstructed grid errors are missing all of the 4-fold symmetric grid distortions. See Self-calibration in Two-Dimensions: The Experiment, supra; Error Estimation for Lattice Methods of Stage Self-calibration, supra. Another disadvantage of this technique is that it does not measure the stage yaw. While this is not necessary for absolute metrology tools that measure target positions over relatively small optical fields (<0.5 mm) such as the Nikon 51 (See Measuring System XY-5i, K. Kodama, et. al., SPIE Vol. 2439, 144:155, 1995 or the Leica LMS IPRO Brochure, Leica), it is absolutely essential for production machines running at large projection fields (>10 mm) such as the Nikon S205. See Nikon Lithography Tool Brochures (Japanese), Nikon. Yet another disadvantage of the aforementioned technique is that the measurement process utilizes the production machine itself to perform the metrology; this means there is less time available for making product on that machine. Yet another disadvantage of this technique is it does not allow us to measure stage error for partially exposed fields.

Therefore, there is a need for overlay metrology tool to determine wafer stage positional errors. In addition, there is a need to measure the wafer stage positioned error in a production environment by the day to day operating personnel. There is also a need to determine the inter-field error of partially exposed fields.

SUMMARY OF THE INVENTION

A wafer stage error map is created using standard overlay targets and a special numerical algorithm. A reticle consisting of a 2-dimensional array of standard overlay targets is exposed several times onto a photoresist coated silicon wafer using a photolithographic projection tool (machine). Next, the overlay targets are measured for placement error using a conventional overlay metrology tool. The resulting overlay error data are then fed into a software program that generates a 2-dimensional wafer stage error map. Most importantly, the method determines wafer stage overlay error, namely, wafer stage distortion and yaw, excluding, total or average translation, and rotation. In summary, the projected field of the overlay reticle is used as a rigid 2-dimensional ruler, and the stage errors are determined in detail with respect to the dimensions of a single projected image field. The method described above does not require the use of a special reference stepper or golden wafer to obtain the wafer stage contributions to placement error. The preferred embodiment is both self-consistent and self-referenced thus reducing the need of cross calibration between different exposure tool sets to a bare minimum. In addition, variations of the preferred embodiment can be used to calculate stage repeatability or precision using standard statistical methods. The ability to determine true stage distortion and yaw without cross calibration or reference to other stepper systems allows the user to more accurately model additional sources of placement error. The method described above can be adjusted for accuracy by simply adjusting the number of measurements made of the alignment attributes or overlay targets. The invention requires exposing and printing an array of fields in a periodic interlocking pattern across the wafer. Next, the resulting overlay target patterns can be measured for overlay error using a standard commercially available optical overlay metrology tool. Next, the distortion and yaw components of stage overlay error are computed using a special algorithm. The method and apparatus form a methodology that can be modified slightly to achieve varying degrees of overall accuracy. The following procedure can be easily implemented in a modern semiconductor manufacturing facility.

A reticle containing special overlay target patterns, for example, see FIG. 21A, is placed into a projection imaging tool or machine, as shown in FIG. 19, where the term lithographic exposure tool includes contact or proximity printers, steppers, scanners, direct write, e-beam, x-ray, SCALPEL, IPL, or EUV machines. See Direct-referencing Automatic Two-Points Reticle-to-Wafer Alignment Using a Projection Column Servo System; M. Van den Brink, H. Linders, S. Wittekoek, SPIE Vol 633, Optical Microlithography V, 60:71, 1986; New 0.54 Aperture I-Line Wafer Stepper with Field by Field Leveling Combined with Global Alignment, M. Van den Brink et al., SPIE Vol. 1463, 709:724, 1991; U.S. Pat. No. 4,861,146, entitled Variable Focal Lens Device, Hatase et al., Aug. 29,1989. Micrascan (TM) III Performance of a Third Generation, Catadioptric Step and Scan Lithographic Tool, D. Cote, et. al., SPIE. Vol. 3051, 806:816, 1997; ArF Step And Scan Exposure System For 0.15 Micron and 0.13 micron Technology Node, supra; 0.7 NA DUV Step and Scan System for 150 nm Imaging with Improved Overlay, supra; Optical Lithography—Thirty Years and Three Orders of Magnitude, J. Bruning, SPIE Vol. 3051, 14:27, 1997; Large Area Fine Line Patterning By Scanning Projection Lithography, H. Muller, et. al., MCM 1994 Proceedings, 100:104; U.S. Pat. No. 5,285,236 entitled Large-area, High-throughput, High-Resolution Projection Imaging System, K. Jain, Feb. 8, 1994; Development of XUV Projection Lithography at 60-80 nm, B. Newnam, et. al., SPIE vol. 1671, 419:436, 1992; Mix-And-Match: A necessary Choice, supra; Optical Lithography—Thirty Years and Three Orders of Magnitude, supra. Next, a photoresist coated wafer is loaded onto the machine; fine wafer alignment is unnecessary.

A series of projection field exposures each containing a sub-array of overlay target patterns is exposed onto the photoresist coated wafers in a partially overlapping interlocking pattern as illustrated in FIGS. 13, 14A, 14B, and 26. Each projection field exposure is separated from the previous exposure by a distance such that neighboring fields will have the inner or outer boxes closest to their perimeters interlocking from one field to another, as shown in FIG. 14B. After the final exposure the wafer is removed from the machine and sent through the final resist development steps.

The resulting resist relief overlay target patterns are then measured for registration, placement or overlay error using an overlay metrology tool such as a KLA-Tencor model 5100, or 5105. See KLA 5105 Overlay Brochure, KLA-Tencor; KLA 5200 Overlay Brochure, KLA-Tencor, Quaestor Q7 Brochure, Bio-rad Semiconductor Systems, or other. See U.S. Pat. No. 5,438,413 entitled Process for Measuring Overlay Misregistration during Semiconductor Wafer Fabrication, Mazor et al., Aug. 1, 1995; U.S. Pat. No. 6,079,256, supra. The resulting data set is entered into a computer algorithm for analysis and the overlay components associated with wafer stage distortion and stage yaw are calculated. If desired, the resulting data can be displayed visually.

The fact that the preferred method utilizes a high precision overlay metrology tool for local measurements and extracts the overlay error associated with wafer stage distortion and yaw in a unique way means that the technique is readily employed in semiconductor manufacturing facilities (fabs). In addition, this invention can be used in conjunction with traditional overlay techniques to better understand, model and correct pattern placement errors. Additional applications of the above outlined procedure include: improved lithographic simulation using conventional optical modeling software, advanced process control in the form of feedback loops that automatically adjust the wafer stage for optimum performance, and finally, wafer stage correction algorithms that compensate for distortion and yaw effects. The software algorithm and apparatus form a self-referenced methodology that does not require a special set of overlay calibration wafers, a special reference stepper tool or assumptions concerning the magnitude of distortion and yaw overlay errors.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

FIG. 9 shows a schematic for inner box 1 of FIG. 11;

FIG. 10A shows inner box 1 as printed on wafer;

FIG. 10B shows inner box 1 on the reticle, M=4;

FIG. 11 shows a schematic for a 2-dimensional overlay reticle;

FIG. 27 shows an overlay error vector plot;

FIG. 28 shows a translation overlay vector plot;

FIG. 29 shows a rotation overlay vector plot;

FIG. 30 shows an overlay measurement;

FIG. 31 shows a perfectly centered box in box structure;

FIG. 46 shows the final results of the method of this invention.

DETAILED DESCRIPTION

Figure 1:
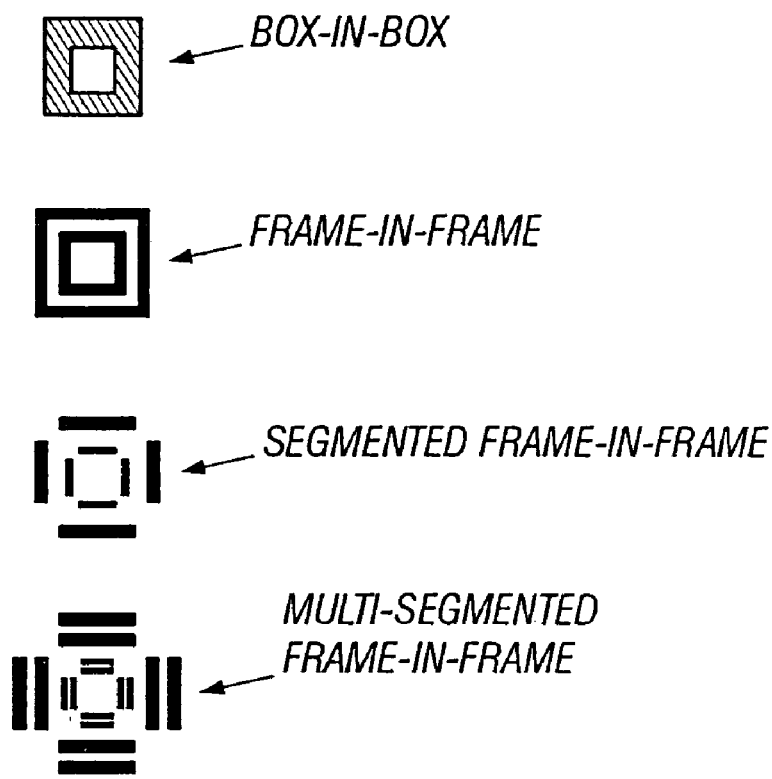
FIG. 1 shows typical overlay patterns or completed alignment attributes.

We are concerned here with measuring the wafer stage-induced overlay error, sometimes called grid or inter-field error. In order to measure and quantify the overlay error that exists between device layers, special overlay target patterns are printed in special locations across the wafer at each lithographic processing step. If the two patterned layers are perfectly aligned to each other, the overlay target patterns will form a perfectly centered box-in-box or frame-in-frame target pattern, as illustrated in FIG. 31. If the two patterned layers are not perfectly aligned, the box-in-box pattern will not be perfectly aligned, for example see FIG. 30. The positional offset or misalignment of the box-in-box target pattern is a measure of the overlay error. FIG. 1 shows a variety of different overlay target patterns or completed alignment attributes ready to be measured for overlay error. The positional offset of the box-in-box overlay target pattern is measured with a commercial optical overlay metrology tool. In some cases, the overlay error can be measured using the photolithographic exposure tool's alignment system. See Matching Management of Multiple Wafer Steppers Using a Stable Standard and a Matching Simulator, supra. Vector displacement plots as shown in FIGS. 27-29, give a visual description of the direction and magnitude of overlay error that are mathematically separated into different spatial components using a variety of regression routines. Many commercial software packages exist (Monolith A Computer Aided Engineering Workstation for Registration Control, supra, Klass II Lens Matching and Distortion Testing in a Multi-Stepper, Sub-Micron Environment, supra) that model and statistically determine the intra-field error components for the purpose of process control and exposure tool set-up. Once determined, they are analyzed and used to adjust the calibration constants of the wafer handling stage to improve pattern alignment. In addition, since different exposure tools are used to produce a given device the exposure tools must be matched or fingerprinted and adjusted so that registration errors unique to one tool are removed or minimized as much as possible. See Mix-And-Match: A Necessary Choice, supra.

Figure 18:
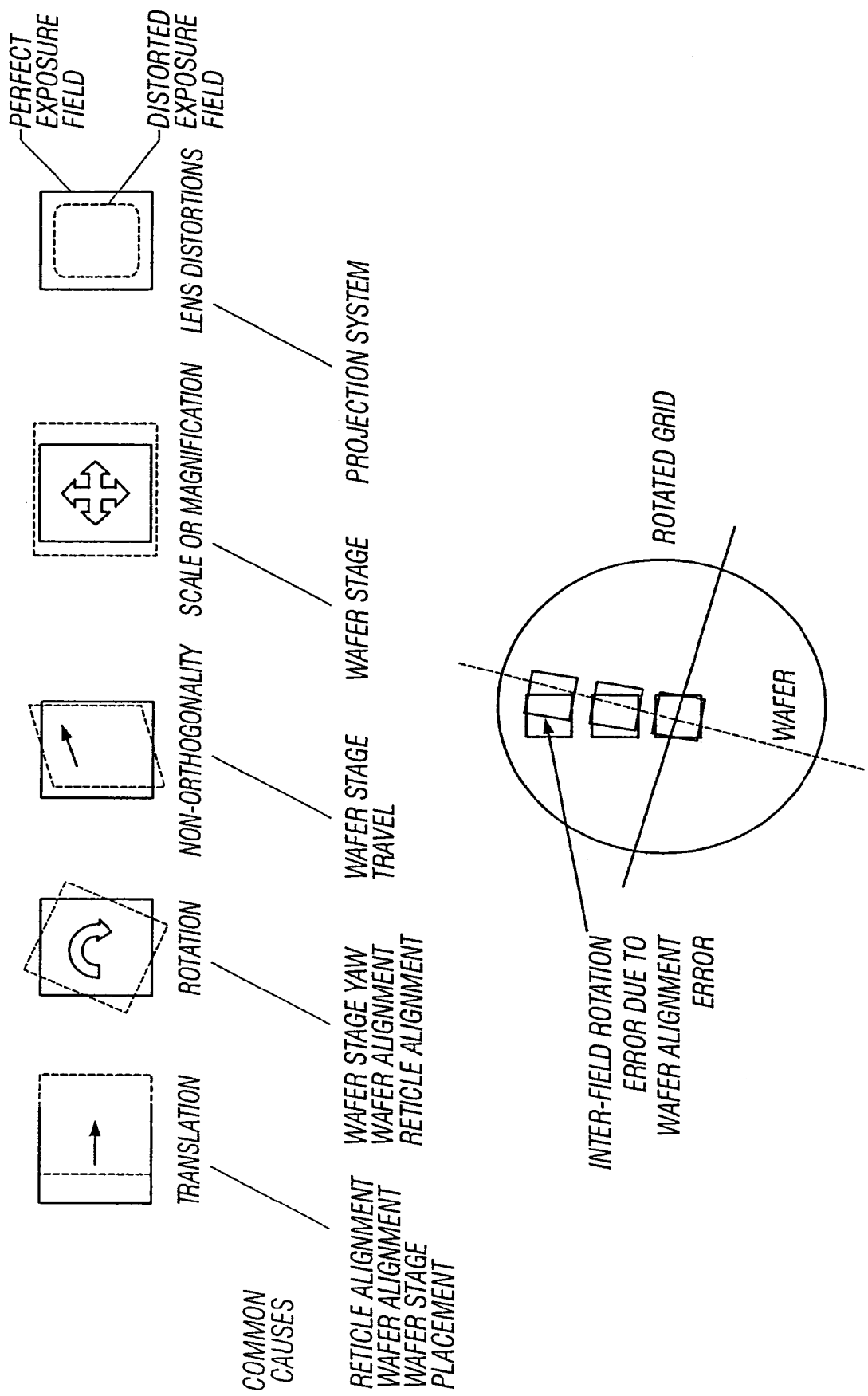
FIG. 18 shows some common causes of overlay or placement error (inter-field and intra-field)

We now describe a simple and accurate methodology that allows for the extraction of the components of wafer stage overlay error, namely wafer stage distortion and yaw effects excluding total translation and rotation, see FIG. 18. In what follows, machine refers to the projection imaging tool whose wafer or substrate stage is being measured.

Figure 15:
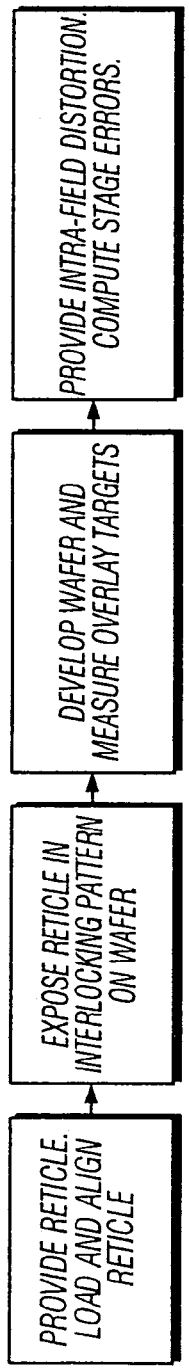
FIG. 15 shows the preferred embodiment/process flow.

The following discussion follows generally the process flow of the preferred embodiment of FIG. 15.

Reticle

Figure 8A:
FIG. 8A shows outer box 2 as printed on wafer.
Figure 12A:
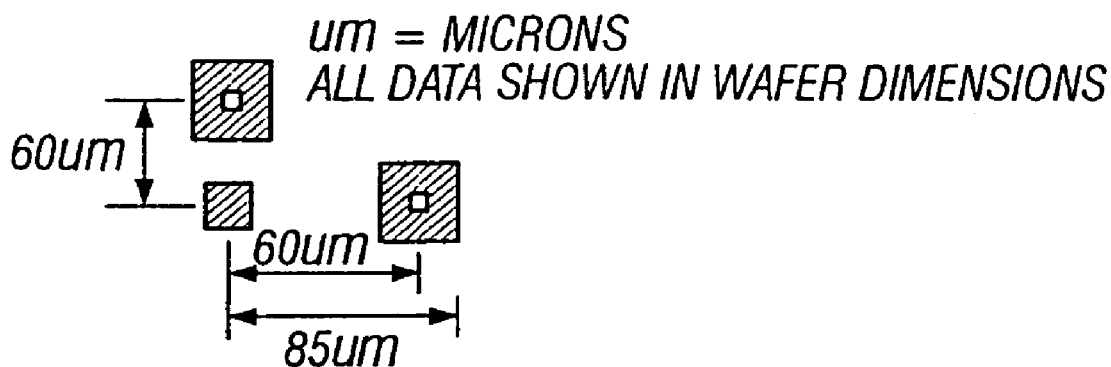
FIG. 12A shows a typical overlay reticle overlay set or group as projected onto a wafer.
Figure 21A:
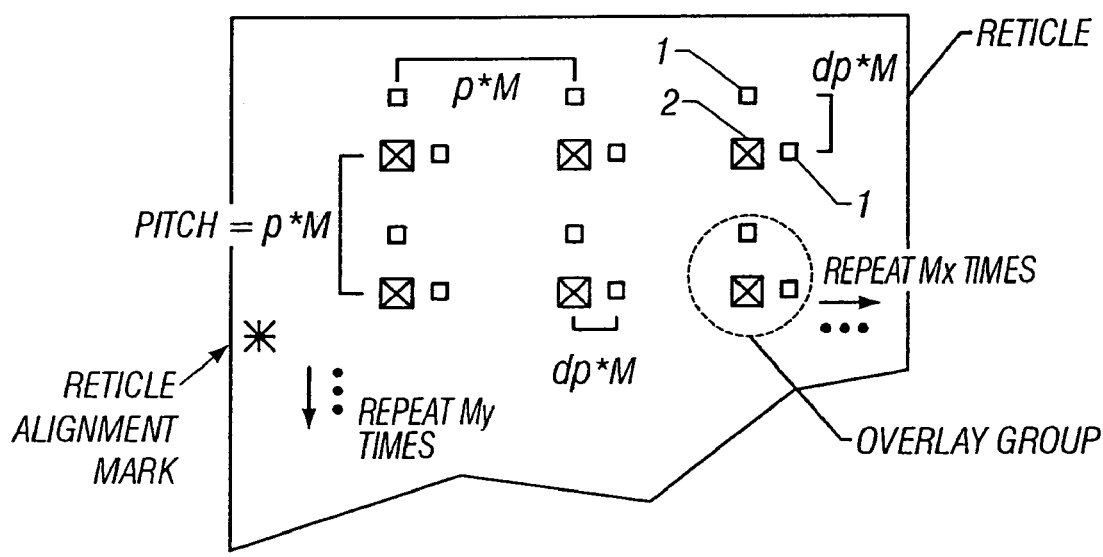
FIG. 21A shows the preferred embodiment overlay reticle in plan view.

A reticle, the preferred embodiment is shown in FIG. 21A, containing an Mx by My array of overlay groups is provided. Dimensions on the preferred embodiment of the reticle are designated as multiples of the reduction magnification ratio M (typically 4 or 5) of the machine on which the reticle is to be typically used. This means that dimensions as projected onto the wafer will be M times smaller than the reticle dimensions. The overlay groups on pitch M*p each consist of three features or alignment attributes each, two of which are distinct and labeled 1 and 2 in FIG. 21A, shown schematically as two small boxes and a large box with an X through it. Alignment attributes 1 and 2 form a complementary pair; when combined by projecting and overlaying them one upon another they form a completed, readable alignment attribute, examples of which are shown in FIG. 1 and in more detail in FIG. 12B. Alignment attributes or features 1 are offset in distinct orthogonal directions from feature 2 by a distance M*dp. FIGS. 8A and 10A show particular examples of features 2 and 1 respectively as projected onto a wafer and printed in positive photoresist, while FIG. 12A shows an overlay group consisting of the projected features of FIGS. 8A and 10A.

Figure 14A:
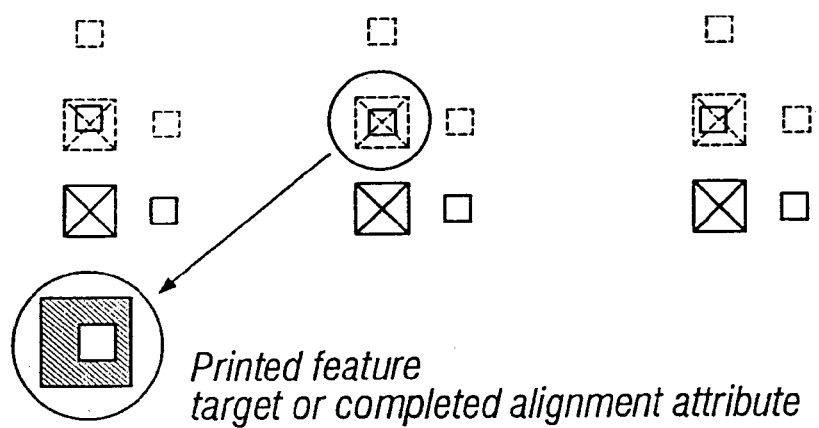
FIG. 14A shows overlay target patterns in the y-direction creating interlocking rows.
Figure 14B:
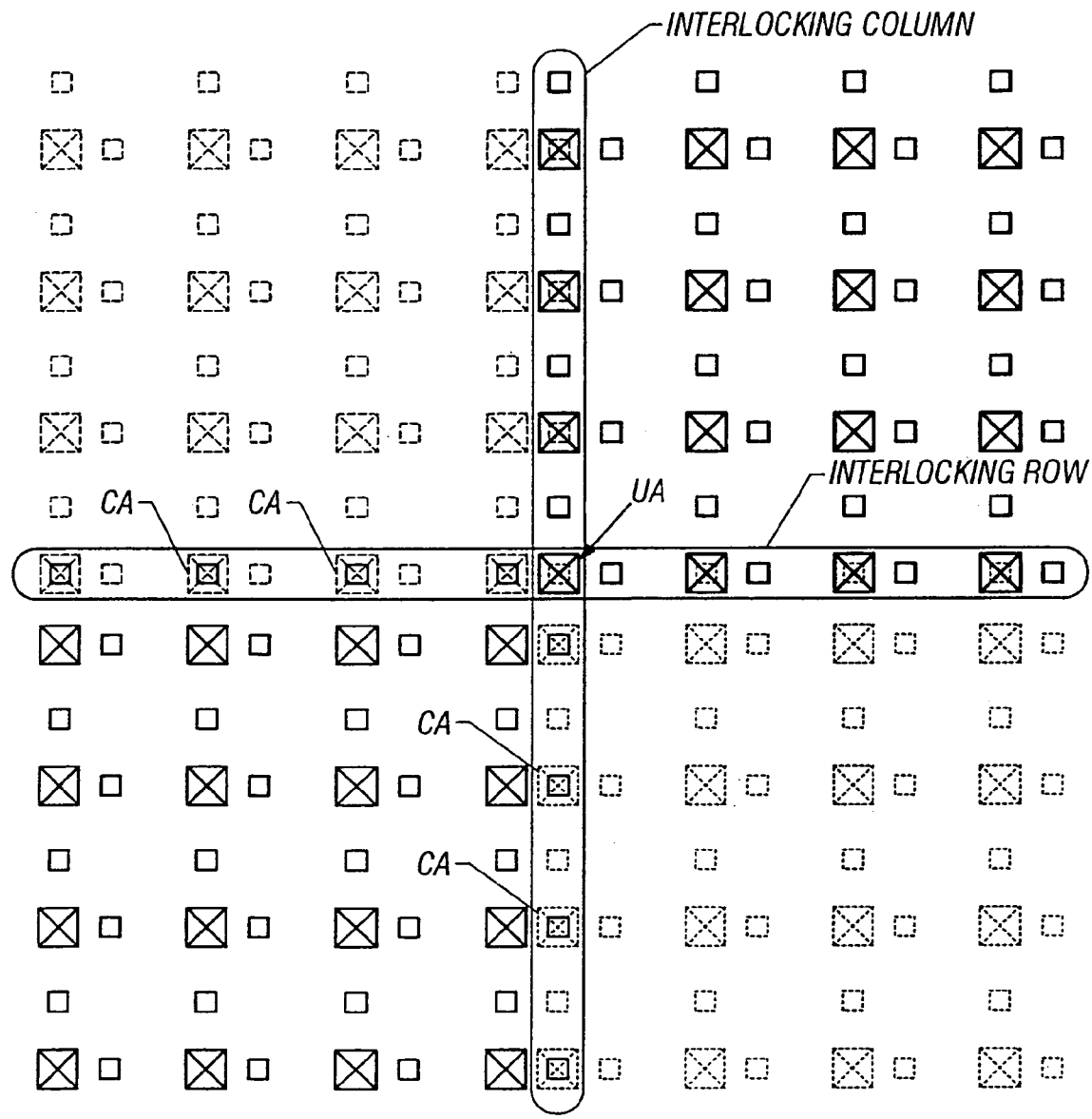
FIG. 14B shows an interlocking exposure of 4 adjacent fields.

Referring to FIGS. 7, 9, 11, and 21A, the dimension M*p that determines the pitch will typically be in the range of about 2 mm to about 35 mm. The upper limit on the pitch M*p is set by the need to have at least two rows and columns of overlay groups present on the projected field and that the interlocking rows and columns have at least two (2) useable, completed alignment attributes. Referring to FIG. 14B the completed alignment attribute becomes unusable, labeled UA in FIG. 14B, when more than two (2) distinct fields overlap to create the alignment attribute. Completed alignment attribute UA is not useable since it is created by the overlap of three (3) distinct fields, while the completed alignment attributes labeled CA in FIG. 14B are useable since they are the result of only two (2) overlapped fields. Thus, if the projected field of the machine has (x,y) dimensions of (Wx, Wy), then for the reticle of FIG. 21A to be useable on this machine we must have at least two useable alignment attributes between adjacent fields; this means:

$$p < \min(Wx\text{-}dp,\ Wy\text{-}dp)/4 \qquad \text{(eq 5.5)}$$

where min(a,b) is the minimum of the numbers a and b.

An aspect of the reticle is that it be capable of creating interlocking rows and columns of completed alignment attributes in a periodic array when exposed for at least one choice of the field stepping pattern. FIG. 14B shows an example of a reticle of the type shown in FIG. 21A exposing an Nx X Ny=4×4 array with a field stepping pattern of (Fx, Fy)=(3*p+dp, 3*p+dp). Here, (Fx, Fy) are the (x,y) field stepping distances on the wafer. The interlocking rows and columns of the resulting pattern at the wafer are indicated. Within the interlocking rows and columns, some of the completed alignment attributes (CA) are indicated. The reticle, once provided, is loaded into the machine's reticle handling system, loaded into the exposure position and aligned.

Exposure

Figure 19:
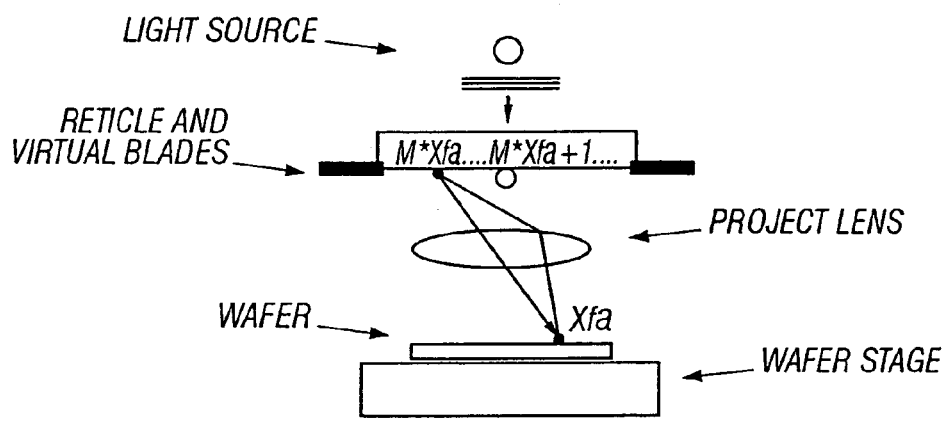
FIG. 19 shows a photolithographic stepper or scanner system.
Figure 20A:
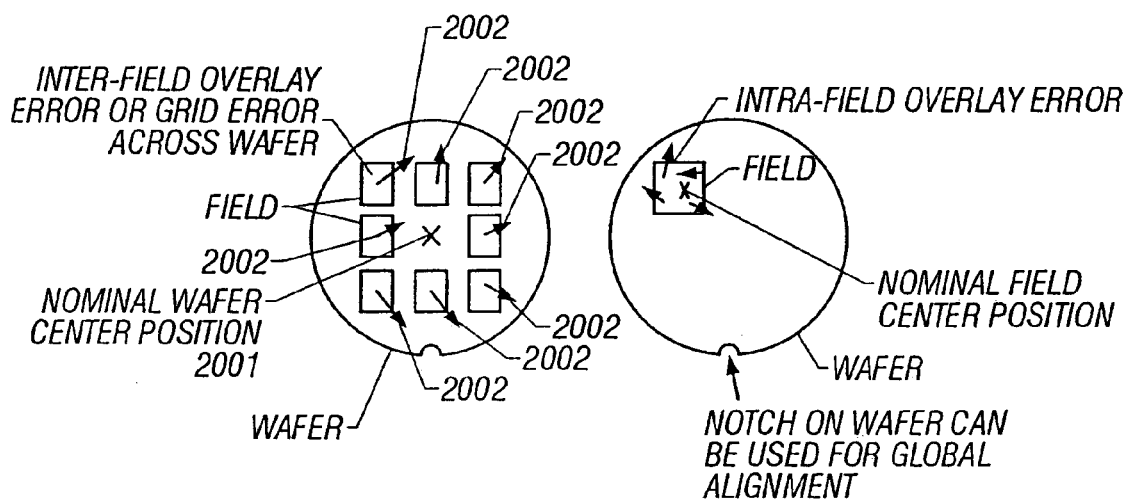
FIG. 20A shows examples of inter-field and intra-field overlay error.
Figure 20B:
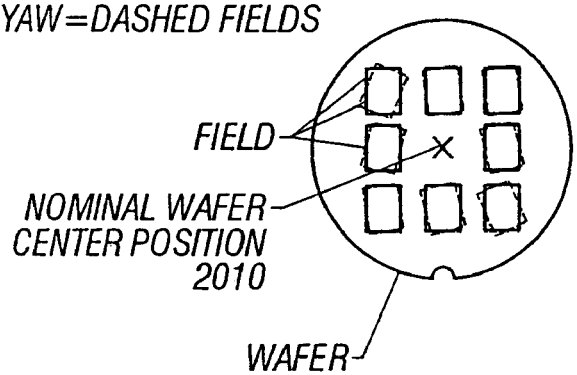
FIG. 20B shows an example of inter-field yaw error.

Next, a photoresist coated wafer is loaded onto the wafer stage of the machine (shown schematically in FIG. 19). A series of field exposures each containing an Nx by Ny (Nx<=Mx, Ny<=My) array of overlay groups is exposed onto the photoresist coated wafer in an interlocking pattern, see FIGS. 14B and 26, producing interlocking rows and columns containing completed alignment attributes. For the reticle of FIG. 21A, following the first exposure, subsequent exposures in the same row are separated by a distance of Fx=(Nx-1)*p+dp or the distance between the leftmost outer box of the projected field and the rightmost inner box of the projected field. Subsequent exposures in the same column are separated by a distance of Fy=(Ny-1)*p+dp or the distance between the outer box at the bottom of the projected field and the topmost inner box within the projected field, as shown in FIG. 21A.

Figure 26:
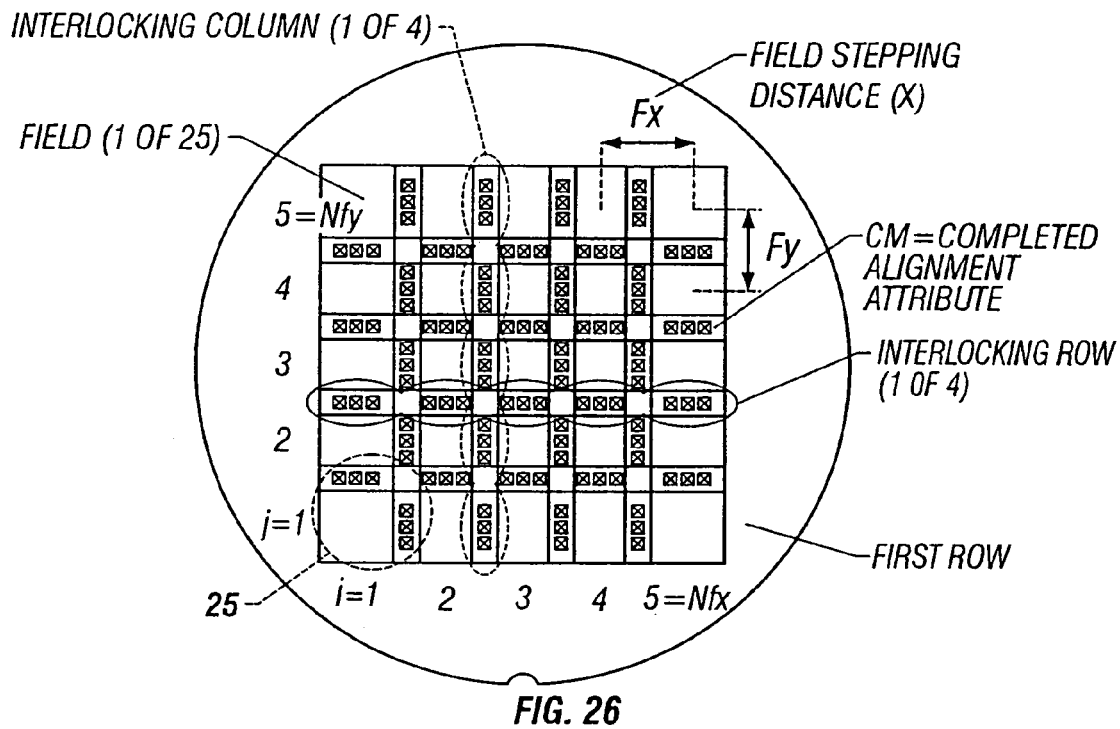
FIG. 26 shows a tiled or interlocking wafer schematic of the self-referencing methodology of this invention.
Figure 25:
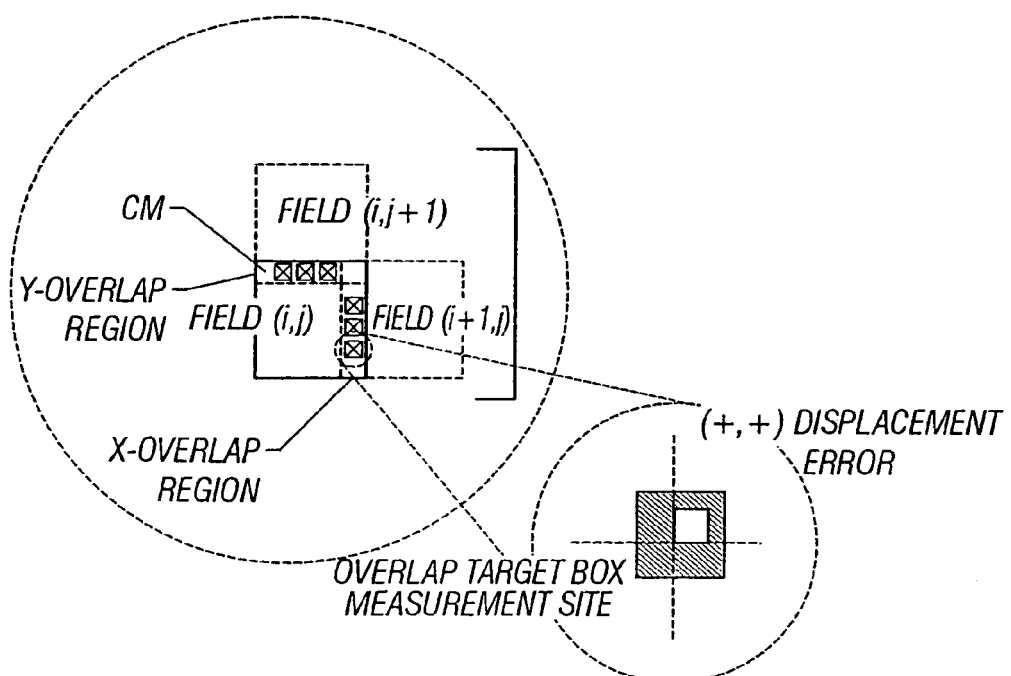
FIG. 25 shows typical overlapping regions showing 3 box-in-box overlay targets.
Figure 32:
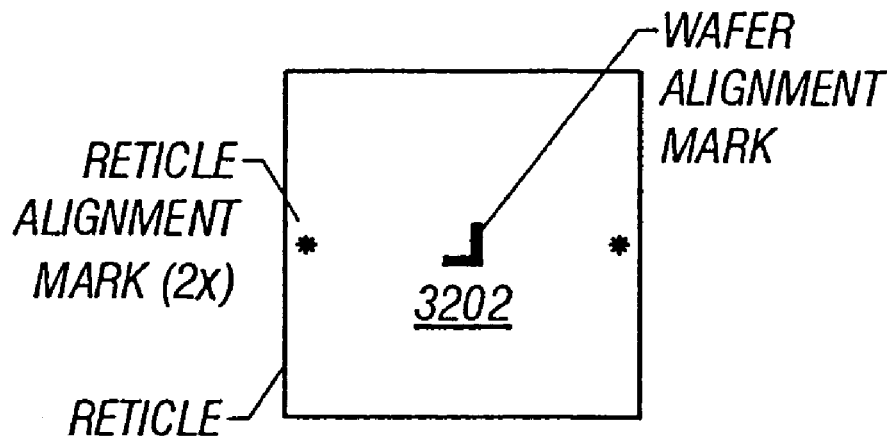
FIG. 32 shows a wafer alignment mark reticle.
Figure 44:
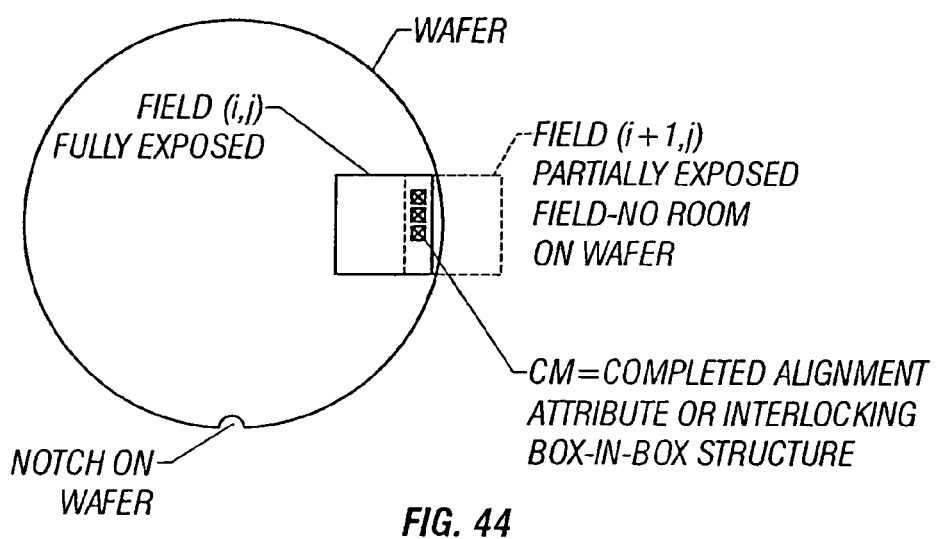
FIG. 44 shows a partially exposed interlocking field.

An example of the final interlocking exposure pattern is shown in FIG. 26. The general field exposure pattern will be in the pattern of an Nfx×Nfy rectangular array of fields less those fields that cannot be printed on the wafer. The ability to include partially exposed fields, as shown in FIG. 44, is important since product wafers typically contain multiple die within an exposure field and therefore the inter-field error of partially exposed fields is important. In general, partially exposed fields where 2 or more interlocking overlay groups are present can have their position measured by this technique. The technique described above creates box-in-box overlay target patterns in the overlapping-regions shown in FIGS. 25 and 26. An aspect of the technique is that we create at least two (2) box-in-box overlay targets in the overlapping rows or columns between adjacent fields. For example, three (3) box-in-box overlay targets are shown in FIGS. 25 and 26. The total number of overlapping box-in-box overlay targets depends on the number of overlay target patterns and the pitch of the Nx by Ny target array.

Develop and Measure

After the last exposure is complete, the wafer is removed from the wafer stage and sent through the final few resist development steps. The resulting overlay target patterns or box-in-box structures are then measured for registration, placement or overlay error using an overlay metrology tool such as a KLA-Tencor model 5100. See KLA 5105 Overlay Brochure, supra; KLA 5200 Overlay Brochure, supra. For each full exposed field, we measure at least two completed alignment attributes along each interlocking edge (row or column) with the adjacent full exposed field. For partially exposed fields, we need to measure at least two completed alignment attributes along all of its interlocking edges. The resulting overlay data set is entered into a computer algorithm for analysis, and the overlay components associated with wafer stage distortion and stage yaw are calculated. If desired, the resulting data can be plotted to form a wafer stage distortion map. Furthermore, the wafer stage distortion results can be used as input into traditional overlay models to produce more accurate results or used in process control strategies. See U.S. Pat. No. 5,877,861, supra.

Intra-Field Distortion

At this point the intra-field distortion is provided.

A number of techniques are available for the determination of the intra-field distortion (dxf, dyf). The preferred technique is the method of Smith, McArthur, and Hunter ("Method And Apparatus For Self-Referenced Projection Lens Distortion Mapping", U.S. patent application Ser. No. 60/254,271), which is a self referencing technique that can be carried out using overlay metrology tools widely available in semiconductor factories and allows for highly accurate determination of the intra-field distortion (dxf, dyf) over a set of grid points to within an x, y translation, rotation, and overall scale or symmetric magnification factor.

Figure 33:
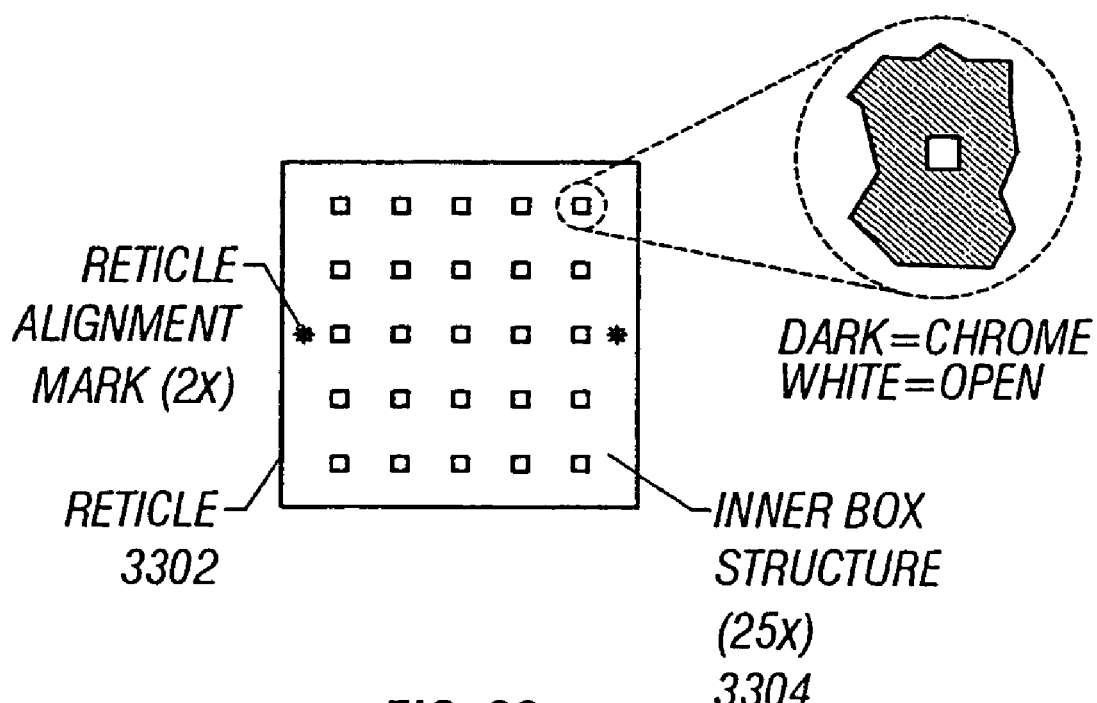
FIG. 33 shows an inner box reticle.
Figure 34:
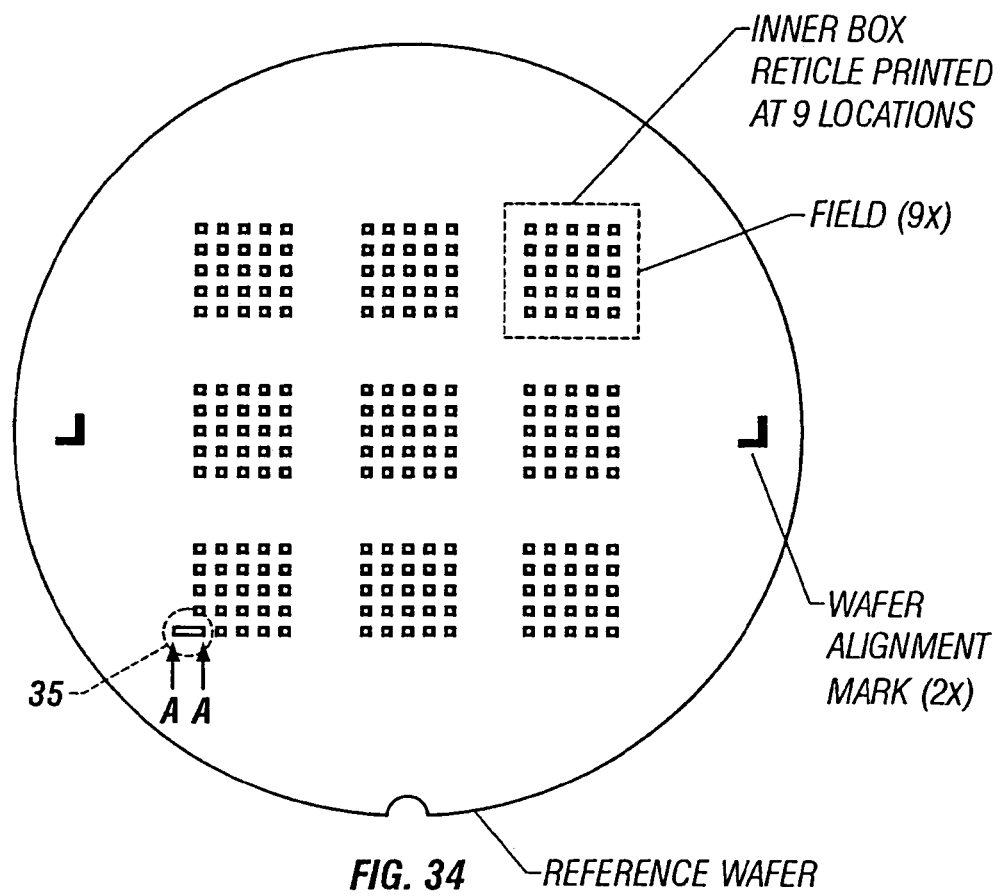
FIG. 34 shows a reference wafer layout.
Figure 35:
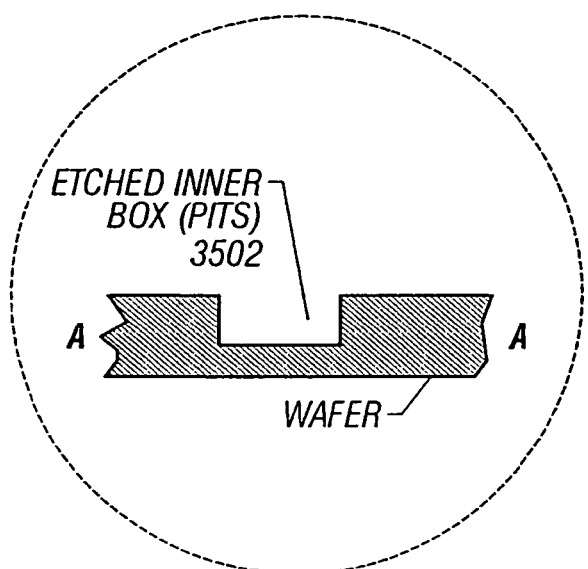
FIG. 35 shows a cross section AA of an etched inner box.
Figure 36:
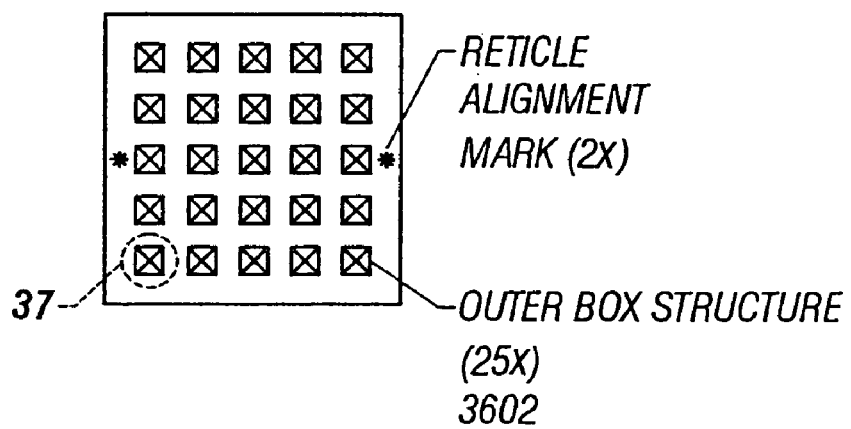
FIG. 36 shows an outer box reticle schematic.
Figure 37:
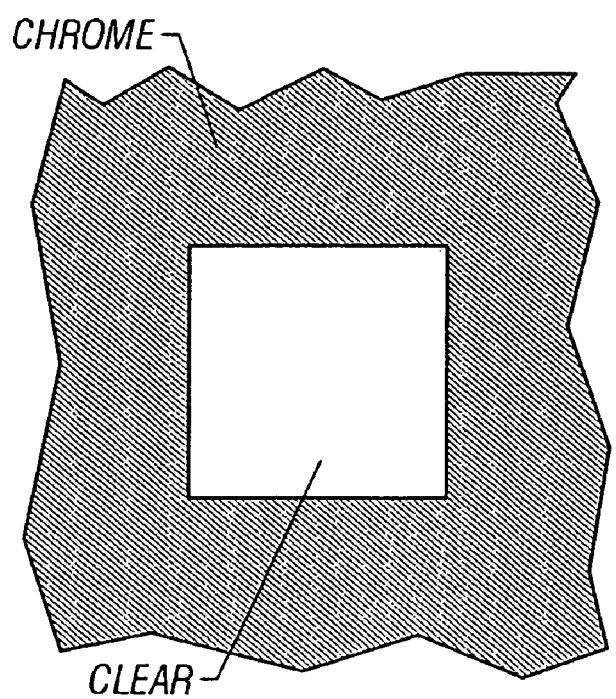
FIG. 37 shows and outer box reticle detail.
Figure 38:
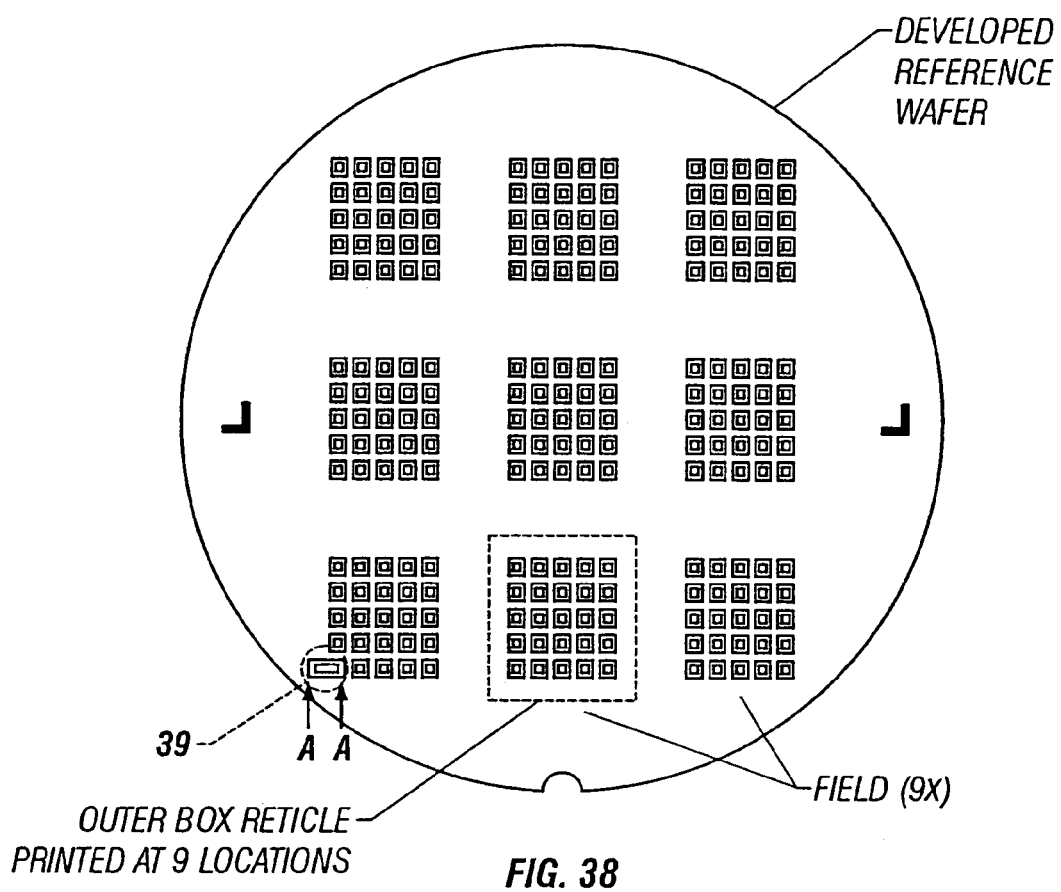
FIG. 38 shows a developed reference wafer ready for overlay measurement.
Figure 39:
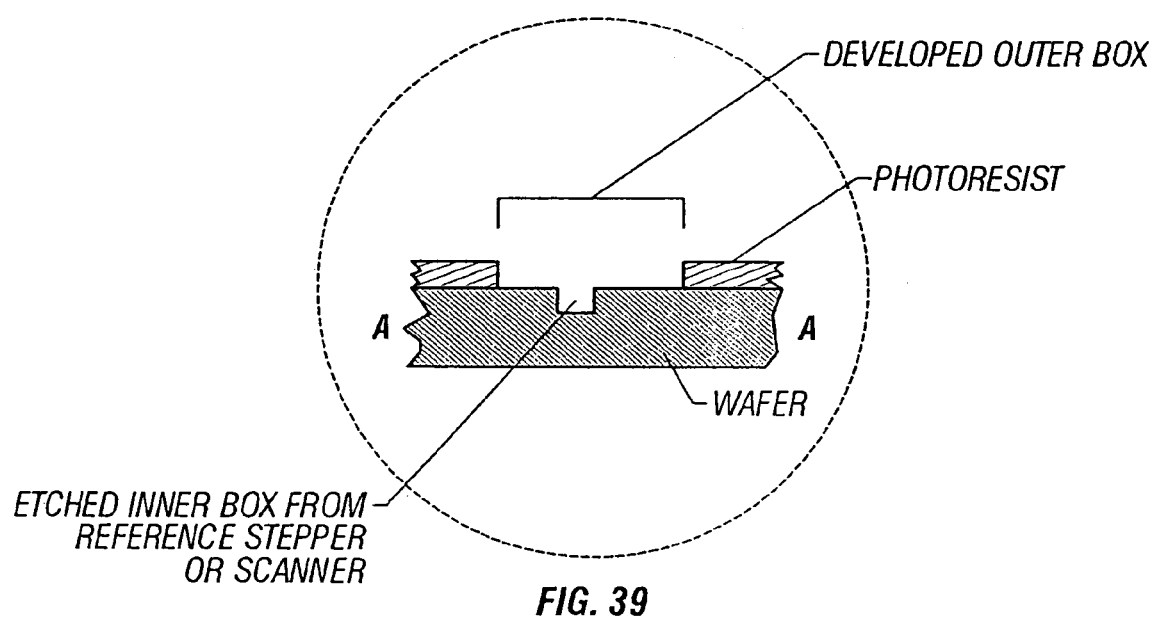
FIG. 39 shows a box-in-box cross section AA of FIG. 38.
Figure 40:
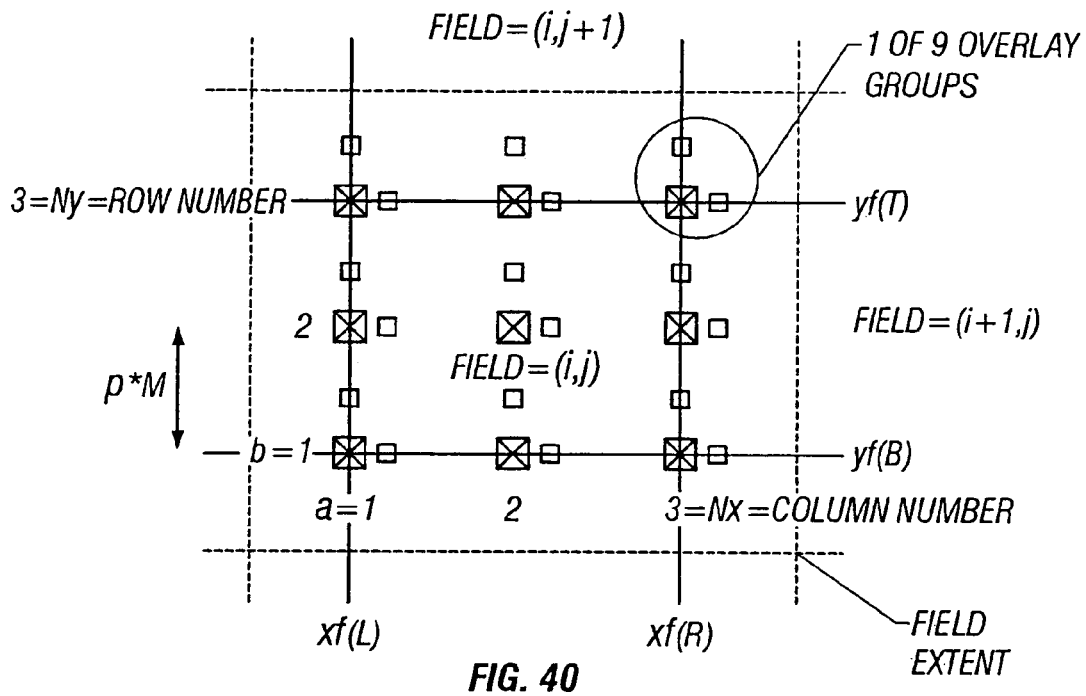
FIG. 40 shows inter-field and intra-field indices.

Another technique is to expose on a photoresist coated wafer, a reticle pattern containing simple crosses or squares for example as shown in FIG. 33, that are located at the desired intra-field grid positions illustrated in FIG. 40, develop the wafer, then measure the position of the resulting grid of boxes using an absolute metrology tool such as a Leica LMS2000, Leica IPRO (Leica Microsystem, Wetzlar, Germany, See Leica LMS IPRO Brochure, supra), Nikon 5I or Nikon 6I (Nikon, Tokyo, Japan, See Measuring System XY-5i, supra). This technique is highly accurate but absolute metrology tools are not widely available in semiconductor factories and so it typically cannot be used.

Yet another technique involves assuming that the photolithographic exposure tools inter-field or stage errors are small over the dimensions occupied by a single field, then printing a small field where a single inner box on a reticle is stepped around by the wafer stage to a grid of locations in the field and then another reticle containing an array of complementary outer boxes covering the full image field is printed over the inner boxes and the resulting box in box measurements are directly interpreted as the intra-field distortion. See A "golden standard" wafer design for optical stepper characterization, supra. This technique is the least accurate and least preferred. With all of these techniques, the overall scale or symmetric magnification is determined with a greater or lesser degree of accuracy, more on this below.

Compute Stage Errors

The following model is used in the determination of the stage errors:

$$BBx(i, j; a, T) = [dxG(i, j+1) + dxf(a, B) - Qg(i, j+1)*yfn(B)] - [dxG(i, j) + dxf(a, T) - Qg(i, j)*yfn(T)] \quad \text{(eq 6)}$$
$$= dxG(i, j+1) - dxG(i, j) - Qg(i, j+1)*yfn(B) + Qg(i, j)*yfn(T) + dxf(a, B) - dxf(a, T)$$

$$BBy(i, j; a, T) = [dyG(i, j+1) + dyf(a, B) + Qg(i, j+1)*xfn(a)] - [dyG(i, j) + dyf(a, T) + Qg(i, j)*xfn(a)] \quad \text{(eq 7)}$$
$$= dyG(i, j+1) - dyG(i, j) + Qg(i, j+1)*xfn(a) - Qg(i, j)*xfn(a) + dyf(a, B) - dyf(a, T)$$

$$BBx(i, j; b, R) = [dxG(i+1, j) + dxf(b, L) - Qg(i+1, j)*yfn(b)] - [dxG(i, j) + dxf(b, R) - Qg(i, j)*yfn(b)] \quad \text{(eq 8)}$$
$$= dxG(i+1, j) - dxG(i, j) - Qg(i+1, j)*yfn(b) + Qg(i, j)*yfn(b) + dxf(b, L) - dxf(b, R)$$

$$BBy(i, j; b, R) = [dyG(i+1, j) + dyf(b, L) + Qg(i+1, j)*xfn(L)] - [dyG(i, j) + dyf(b, R) + Qg(i, j)*xfn(R)] \quad \text{(eq 9)}$$
$$= dyG(i+1, j) - dyG(i, j) + Qg(i+1, j)*xfn(L) - Qg(i, j)*xfn(R) + dyf(b, L) - dyf(b, R)$$

Where:

T, B, R, L=designate the top, bottom, right and left most row or column within each field, see FIG. 40.

(i, j)=field indices, see FIGS. 26 and 40. i=1:Nfx, j=1:Nfy but not all i, j pairs occur equations 6-9. If the field or the corresponding measurement set (T or R) does not occur then that equation is absent. i labels fields consecutively left to right while j labels fields consecutively from bottom to top.

(a, b)=intra-field indices or indices corresponding to each overlay group, see FIG. 40. a=1:Nx, b=1:Ny designate the overlay group number within each field a labels overlay groups consecutively left to right while b labels overlay groups consecutively from bottom to top.

xf(L), xf(R)=x intrafield nominal position of left (a=1), right (a=Nx) overlay groups, see FIG. 40. These are known quantities.

yf(T), yf(B)=y intrafield nominal position of the top (b=Ny), bottom (b=1) overlay groups, see FIG. 40. These are known quantities.

xfn(a), yfn(b)=(x,y) intrafield nominal position of overlay group (a,b). These are known quantities.

BBx, BBy(i,j;a,T)=(x,y) measured overlay errors along the top (b=Ny) edge of field (i,j) at column a. a covers the range a=1:Nx but the actual number of measurements made along this edge is at the user's discretion subject to the availability of a site on partially exposed fields. The preferred number of sites along each edge is 3 but only a total of 2 along each edge (T, B, L, R) is required for the purposes of this invention. To count the number of measurements associated with field (i,j), this will be the sum of the number of available measurements in the 4 sets:

Set 1: (i,j;a,T), a=1:Nx
Set 2: (i,j;b,R), b=1:Ny
Set 3: (i,j−1;a,T), a=1:Nx
Set 4: (i−1,j;b,R), b=1:Ny

BBx, BBy(i,j;b,R)=(x,y) measured overlay errors along the right (a=Nx) edge of field (i,j) at row b. b covers the range b=1:Ny but the actual number of measurements made along this edge is at the user's discretion subject to the availability of a site on partially exposed fields.

dxG(i,j), dyG(i,j), Qg(i,j)=inter-field placement errors in x, y, and yaw or rotation at field (i,j). These are the error terms that characterize the wafer stage stepping performance and are the quantities that this invention will determine.

dxf(b,L), dyf(b,L)=x,y intra-field distortions along the left edge (a=1 column) of the field, see FIG. 40. These are known quantities.

dxf(b,R), dyf(b,R)=x,y intra-field distortions along the right edge (a=Nx column) of the field, see FIG. 40. These are known quantities.

dxf(a,T), dyf(a,T)=x,y intra-field distortions along the top edge (b=Ny row) of the field, see FIG. 40. These are known quantities.

dxf(a,B), dyf(a,B)=x,y intra-field distortions along the bottom edge (b=1 row) of the field, see FIG. 40. These are known quantities.

So all of the quantities in equations 6-9 are known except the inter-field or grid error (dxG, dyG, Qg)(i,j) which must be solved for. Equations 6-9 are typically over determined in the sense of equation counting (there are more equations than unknowns) but are still singular in the mathematical sense; the null space of equations 6-9 has a dimension of 3. See Numerical Recipes, The Art of Scientific Computing, W. Press, et. al., Cambridge University Press, 52:64, 1990. Now it can be mathematically shown that this 3 dimensional null space corresponds to our inability to uniquely solve for the inter-field error to within an overall X or Y translation and an overall rotation. Put differently, if error (dxG, dyG, Qg)(i,j) is a solution to equations 6-9, then (dxG(i,j)+Tx−qg*yG(i,j), dyG(i,j)+Ty+qg*xG(i,j), Qg(i,j)+qg) is also a solution of equations 6-9 where:

Tx, Ty=arbitrary translation, qg=arbitrary rotation
(xG,yG)(i,j) is the nominal center position in wafer coordinates of field (i, j).

To uniquely define a solution we can require that the computed solution have zero values for these modes.

Then:

$$\Sigma dxG(i,j) = 0 \text{ no } x \text{ translation} \quad (eq\ 10)$$

$$\Sigma dyG(i,j) = 0 \text{ no } y \text{ translation} \quad (eq\ 11)$$

$$\Sigma yG(i,j)*dxG(i,j) - xG(i,j)*dyG(i,j) = 0 \text{ no rotation} \quad (eq\ 12)$$

Σ denotes summation over all inter-field grid point pairs (i, j) that have their offsets and yaws determined. Equations 6-9 are typically solved using the singular value decomposition to produce the minimum length solution. See Numerical Recipes, The Art of Scientific Computing, supra. It can be shown that the constraints of equations 10-12 effectively define a unique solution within the null space of equations 6-9, and therefore they can be applied after the minimum length solution, (dxGm, dyGm, Qg)(i,j), has been determined.

Using eq 13-15 we solve for Tx, Ty, qg, $$\Sigma dxGm(i,j) + Tx - qg*yG(i,j) = 0 \quad (eq\ 13)$$

$$\Sigma dyGm(i,j) + Ty + qg*xG(i,j) = 0 \quad (eq\ 14)$$

$$\Sigma yG(i,j)*(dxGm(i,j) + Tx - qg*yG(i,j)) - xG(i,j)*(dyGm(i,j) + Ty + qg*xG(i,j)) = 0 \quad (eq\ 15)$$

and the inter-field distortion array satisfying eq 10-12 and eq 6-9 is:

$$dxG(i,j) = dxGm(i,j) + Tx - qg*yG(i,j) \quad (eq\ 16)$$

$$dyG(i,j) = dyGm(i,j) + Ty + qg*xG(i,j) \quad (eq\ 17)$$

$$Qg(i,j) = Qgm(i,j) + qg \quad (eq\ 17.1)$$

The translation (Tx, Ty) ambiguity occurs because only differences of dxG or dyG at different sites occur and therefore adding a constant to dxG or dyG does not change the right hand sides of equations 6-9. The minimum length solution will typically produce a solution (dxGm, dyGm, Qgm)(i,j) with some translation component, but since we know our measurements cannot pick up any translation components we need to project them out (eq 10, 11, 16, 17) to arrive at a translation free solution.

To discuss the rotation ambiguity, we separately break out the rotational parts of (dxG, dyG, Qg)(i,j)

as:

$$(dxG, dyG, Qg)(i,j) = (dxG', dyG', Qg')(i,j) + (-qg*yG(i,j), qg*xG(i,j), QG) \quad (eq\ 18)$$

where qg is the grid rotation and QG is the average stage yaw (defined by eq 18 and 20) and the primed solution is rotation free, that is:

$$\Sigma yG(i,j)*dxG'(i,j) - xG(i,j)*dyG'(i,j) = 0 \quad (eq\ 19)$$

$$\Sigma Qg'(i,j) = 0 \quad (eq\ 20)$$

Plugging the form given by equation 18 into equations 6-9 it can be shown that only the combination qg−QG occurs. This means that only the average stage yaw relative to the gross rotation of the stage can be determined from equations 6-9. This makes physical sense since we are referencing the measurements on the tiled wafer to itself, see FIG. 26. The choice of setting qg=0 to determine a unique solution is one of convenience; by doing so we leave all the ambiguity in the machine grid translation and rotation and consider the average stage yaw to be known relative to the machine grid.

Setting QG itself, or other linear combinations of qg and QG to 0 will produce other solutions that differ only in the interpretation of the gross rotation terms of the solution of equations 6-9.

The final result of this invention is a listing of the machine intra-field errors. This can be expressed in the form of a table shown in FIG. 46. There the machine id or unique identifier, x and y field stepping distances (Fx, Fy) and a list of the nominal center position of each field (xG, yG), the field center offset error (dxG, dyG) and field yaw (Qg) are listed.

Further Interpretation of the Solution For Intra-field Error
General

What the above procedure accomplishes is a detailed assessment or map of the wafer stage distortion (dxG(i,j), dyG(i,j)) and yaw (Qg(i,j)), both called stage error for short. This map will contain both systematic and random components. By systematic, we mean that there is a portion of (dxG, dyG, Qg) (i,j) that will be constant or unvarying over a short (<1 day) period of time, and by random components we mean that portion of (dxG, dyG, Qg)(i,j) which varies over a short time period. By measuring the stage error using a number of wafers over a short time period, we can apply standard statistical methods to calculate the systematic part of the stage error.

Typically, we will average the results of all the wafers to get the systematic part of the stage error and then characterize the random part in terms of the standard deviation of the resulting distribution of stage error. The systematic part can then be analyzed, and the stage motion corrected either through lookup corrections to the stage motion, hardware adjustments or a combination of both. Having thereby minimized the stage error as much as possible, the remaining systematic error, which will be the above measured systematic error minus the effect of any corrective action we might have taken, and the random error ultimately determine the best possible performance of the wafer stage. Furthermore, a large or out of machine specification random error should also trigger a wafer stage maintenance to bring the machine back into specification or into the factory wide operating envelope.

Intra-field Translation

So for a given, definite set of intra-field distortions (dxf, dyf)(a,b) we can uniquely determine the inter-field or grid distortions. However, we do not always know some components of the intra-field distortion such as translation, rotation, and scale or symmetric magnification. Not knowing the translation (Txf, Tyf) of the intrafield distortion has no effect whatsoever on the our determination of inter-field quantities since the intra-field terms only occur in equations 6-9 as differences (dxf(a,T)−dxf(a ,B), etc. and therefore (Txf, Tyf) completely cancel out on the right hand side of equations 6-9.

Intra-field Rotation

If we do not know the intra-field rotation, qf, we would still be provided with the intra-field distortion (dxf, dyf)(a,b) as a definite set of numbers only they would be rotation free:

$$\Sigma yfn(b)*dxf(a,b)-xfn(a)*dyf(a,b)=0 \quad (eq\ 21)$$

where $\Sigma$ denotes a summation over the entire Nx×Ny grid of intra-field points. We can certainly solve equations 6-9 as detailed above only now the interpretation of QG (eq. 18, 20) is different. Analyzing the gross or average intra-field rotation, qf, in a manner similar to the above analysis of qg (grid rotation) and QG (average stage yaw) it can be shown that equations 6-9 allow us to determine only the quantity:

$$Qrel=QG-qg+qf \quad (eq\ 22)$$

There are various ways of interpreting this ambiguity but the most convenient is to remove the average stage yaw from our solution and separately log the measured difference Qrel which is valuable in machine to machine or machine to itself matching. So, $$\Sigma Qg(i,j)/Nf=Qrel \quad (eq\ 23)$$

where Nf is the number of fields where we have determined the grid quantities and we change our expression for the stage yaw Qg (i,j) by subtracting Qrel from it, $$Qg(i,j)\rightarrow Qg(i,j)-Qrel \quad (eq\ 24)$$

This still leaves us with a detailed solution of grid distortion with the average yaw and average grid rotation removed and the additional knowledge of the relative rotation Qrel whose meaning is equation 22. Knowing Qrel, we can adjust the reticle rotation (intra-field rotation qf), the average stage yaw (QG) or some combination of the two to make Qrel zero or use it for other stage to stage comparisons.

Intra-field Scale

If we do not know the intra-field scale or symmetric magnification, we would still be provided with the intra-field distortion (dxf, dyf)(a,b) as a definite set of numbers only they would contain no implicit scale or symmetric magnification factor:

$$\Sigma xfn(a)*dxf(a,b)+yfn(a)*dyf(a,b)=0 \quad (eq\ 25)$$

($\Sigma$ denotes a summation over the entire Nx×Ny grid of intra-field points); put differently, the intra-field distortion does not contain a contribution of the form:

$$(dxf(a,b),\ dyf(a,b))=(sf*xfn(a),\ sf*yfn(b)) \quad (eq\ 25.1)$$

where sf (the intra-field scale) is not equal to zero.

To discuss this case, we separately break out the inter-field scale or symmetric magnification parts of (dxG, dyG, Qg) (i,j) as:

$$(dxG,\ dyG,\ Qg)(i,j)=(dxG',\ dyG',\ Qg')(i,j)+(sg*xG(i,j),\ sg*yG(i,j),\ 0) \quad (eq\ 26)$$

where sg is the grid scale factor and the primed solution is scale free, that is:

$$\Sigma xG(i,j)*dxG'(i,j)+yG(i,j)*dyG'(i,j)=0 \quad (eq\ 27)$$

Analysis of equations 6-9 then shows that if sf is the intra-field scale factor as defined by equations 25 and 25.1 and sg the inter-field scale factor defined equations 26 and 27, then the quantity:

$$srel=sg-sf \quad (eq\ 28)$$

which is the relative scale difference between the grid and intra-field, is determined.

The most convenient interpretation of this is to remove the scale from our inter-field solution and separately log the measured difference, srel, which is valuable in machine to machine or machine to itself matching. So:

$$\Sigma xG(i,j)*dxG(i,j)+yG(i,j)*dyG(i,j)/\Sigma xG(i,j)^2+yG(i,j)^2=srel \quad (eq\ 29)$$

and we change our expression for the intrafield grid distortion (dxG, dyG, Qg)(i,j) by subtracting srel from it, $$(dxG,\ dyG,\ Qg)(i,j)\rightarrow(dxG,\ dyG,\ Qg)(i,j)-(srel*xG(i,j),\ srel*yG(i,j),\ 0) \quad (eq\ 30)$$

where Σ denotes a summation over all of the fields, (i,j), where the stage error has been determined.

This still leaves us with a detailed solution of grid distortion with the average grid scale removed and the additional knowledge of the relative scale srel whose meaning is equation 28. Knowing srel, we can adjust the projection lens magnification (intra-field scale sf), the average stage scale (sg) or some combination of the two to make srel zero or use it for other stage to stage comparisons.

1$^{st}$ Alternate Embodiment

Thus far, the preferred embodiment has been used to extract the components of overlay error associated with wafer stage distortion and yaw using a single wafer to fully account for all repeatable and non-repeatable effects of wafer stage placement error. To extract the repeatable effects of wafer stage placement error using the method of the preferred embodiment we must expose a number, N, of wafers on the same machine and average the resulting set of N wafer stage errors. We now describe a variation of the preferred embodiment that allows the user to extract the repeatable components of overlay error associated with wafer stage distortion and stage yaw in the presence of wafer stage non-repeatability using only one or a minimum number of wafers.

First, the overlay target reticle and photoresist coated wafer are loaded into the projection lithography tool (machine) and properly aligned as described in the preferred embodiment. Next, the machine is programmed to the same field stepping pattern as used in the preferred embodiment; however, in this variation the exposure dose energy for each exposure will be 2*Eo/N, where N is some predetermined number (typically 20) and Eo is the E-zero or minimum exposure dose required for a large (>200 micron) open area pattern on the reticle to become fully developed or cleared (in the case of positive resist). After the wafer is exposed, the wafer stage is moved back to the first exposure field of the field stepping pattern, and the sub Eo exposure sequence begins again for the second time. This process is repeated N times such that each field in the field stepping pattern will be exposed with a total dose of 2*Eo. The wafer is then removed from the wafer stage and sent on for final resist processing. The finished wafer is then sent for overlay measurement as described in the preferred embodiment. The result of this procedure is to produce a single wafer wherein the random part of the stage error will be effectively averaged out over approximately N/2 or more exposures and thereby minimized with respect to the systematic error resulting in a better estimate of the systematic error than could be obtained with a single wafer and single exposure sequence.

Figure 16:
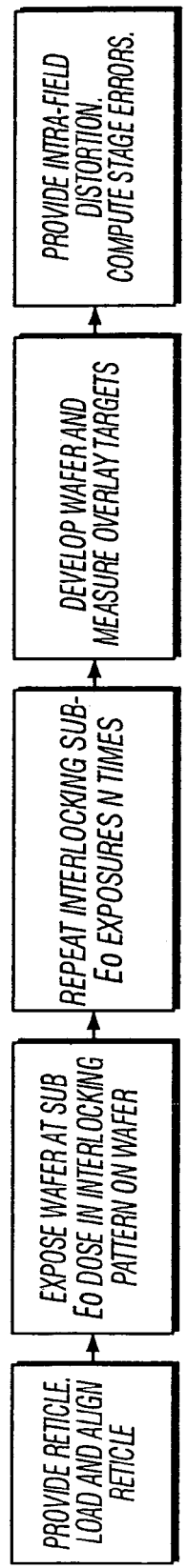
FIG. 16 shows the first variation of the preferred embodiment/process flow.

This first variation of the preferred embodiment allows the user to use one wafer for the extraction of systematic wafer stage distortion and yaw in the presence of random wafer stage induced placement or non-repeatability error. The flow diagram for this variation of the preferred embodiment is shown in FIG. 16. If the machine on which we are measuring cannot do the desired sub-Eo exposure, then we can use the lowest exposure dose available and expose enough wafers at this dose so we get the user desired averaging effect.

2$^{nd}$ Alternate Embodiment

Figure 17:
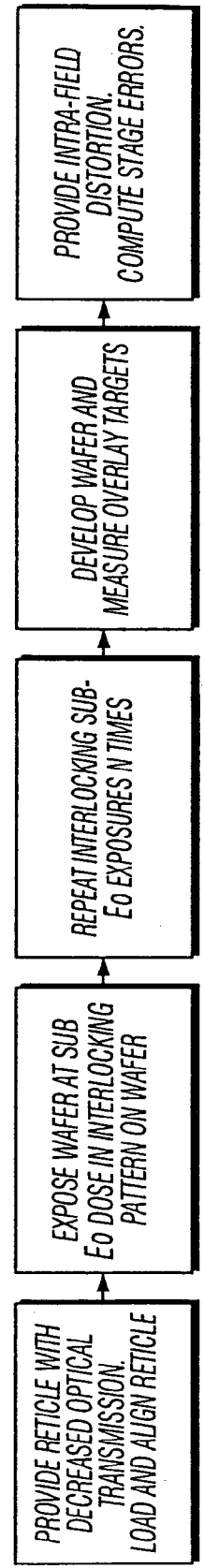
FIG. 17 shows the second variation of the preferred embodiment/process flow.
Figure 21B:
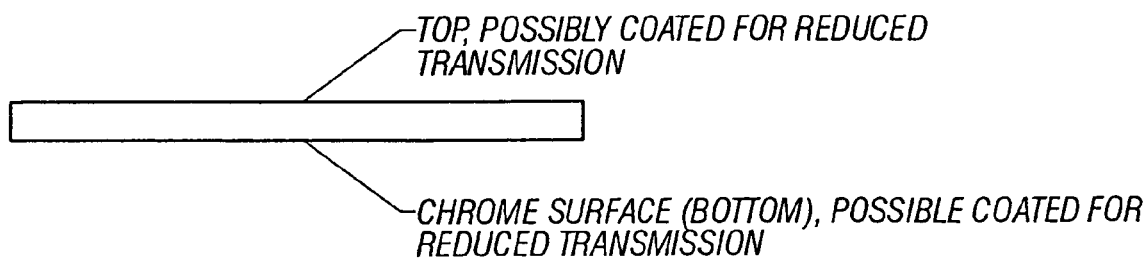
FIG. 21B shows a side view of the reticle of FIG. 21A.
Figure 22:
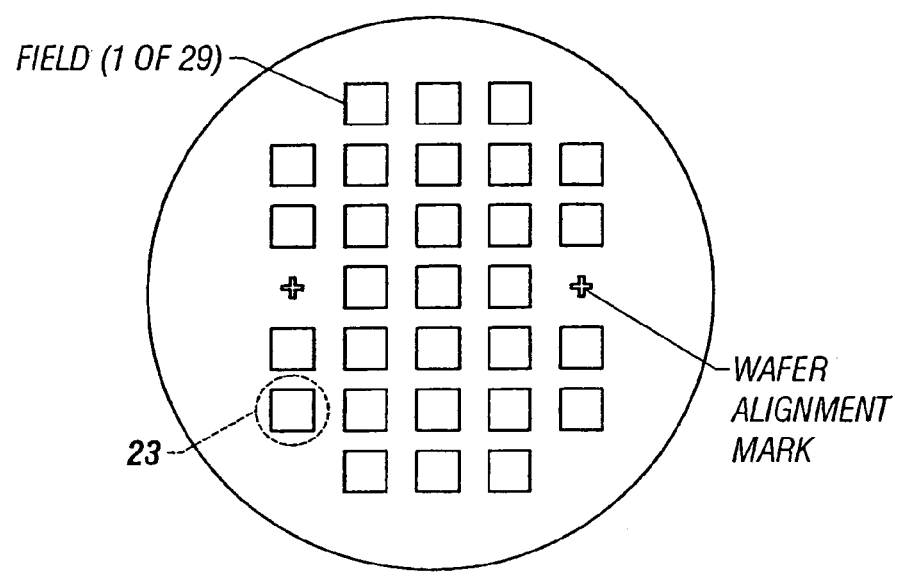
FIG. 22 diagrams the wafer in a prior art, stage matching and wafer stage error technique.
Figure 23:
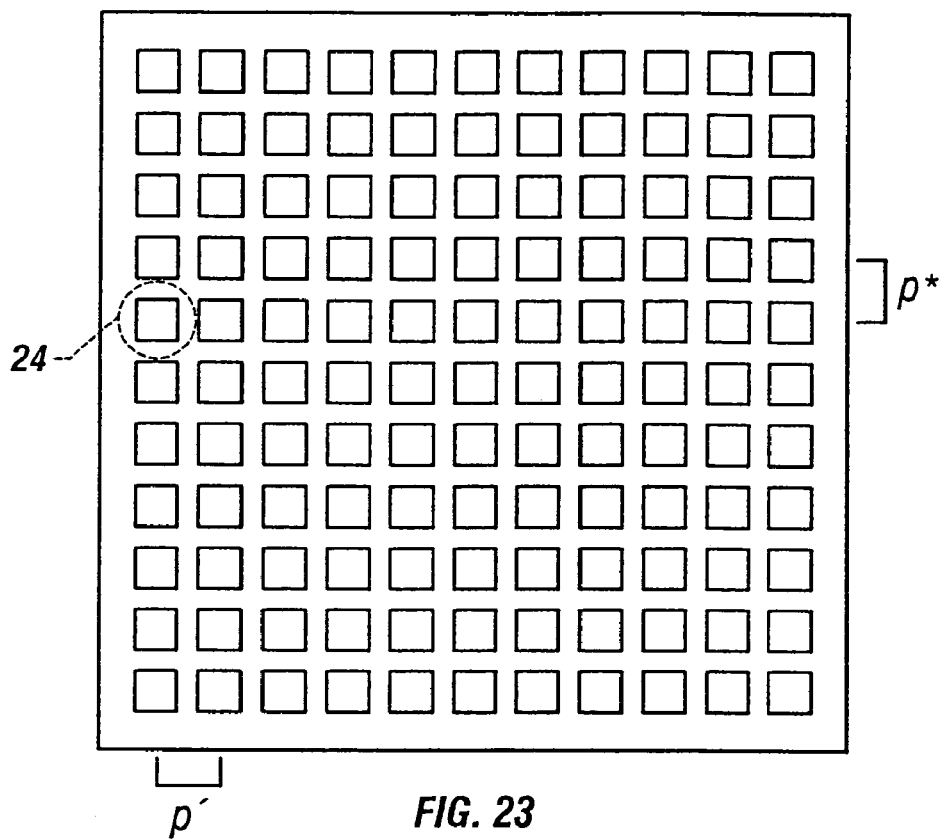
FIG. 23 shows an 11 by 11 target array.
Figure 24:
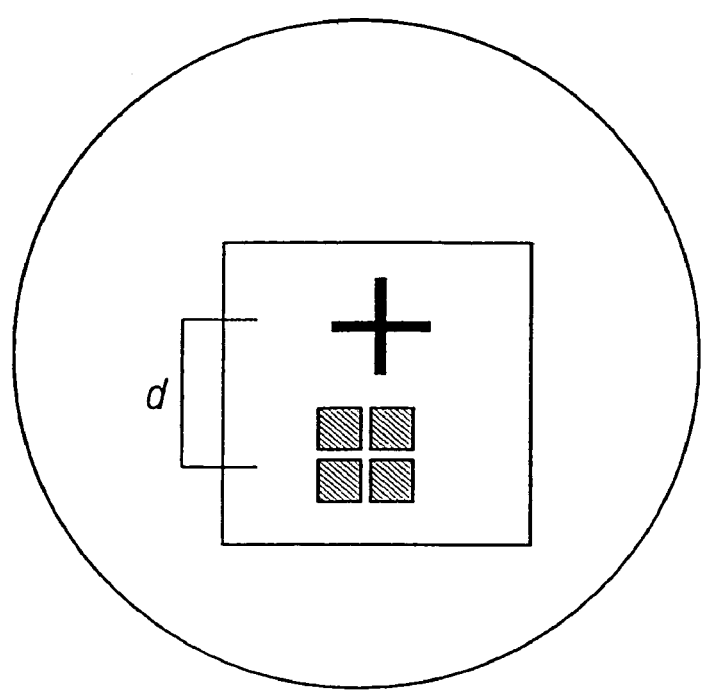
FIG. 24 shows the targets of FIG. 23 in more detail.

In this embodiment, see flow diagram FIG. 17, we also perform multiple exposure sequences to average out the effect of machine random stage error, but now we provide the overlay reticle of FIG. 21A with a partially reflecting dielectric coating either on its top (non-chrome) or possibly bottom surface (chrome coated or machine optical object plane), as shown in FIG. 21B. A 95% reflecting dielectric coating applied to the overlay reticle means that if we do 40 exposure sequences at a dose of Eo each; the net effect is to expose the wafer with a dose of 2*Eo and to have effectively averaged over 20 or more exposures.

An advantage of this technique is that we are will not as limited by the machine's ability to do sub-Eo exposures. A further advantage of this technique is that since the exposure doses can be made at the same dose as used in production runs, the dynamics of the stage movement during the measurement sequence will be the same and therefore the stage error measured under identical operating conditions. Thus, if the production dose is a*Eo, the overlay reticle has a coating that reflects a fraction R of light incident on it, then the number of exposures (N) required to get a dose of b*Eo on the measurement wafer is:

$$N=1+\text{floor}(b/(a*(1-R)))  \quad (\text{eq } 31)$$

and the minimum number of exposures we are effectively averaging over (for purposes of reducing the random error contribution) is:

$$Neff=N/b \quad (\text{eq } 32)$$

or more, and floor(x)=integer part of the real number x.

As a typical example, a production run at 4*Eo (a=4), using an overlay reticle that is 98% reflecting (R=0.98) and requiring a dose on the measurement wafers of 2*Eo (b=2) means the number of required exposures is (eq 31) N=26, and the minimum number of exposures we are effectively averaging over for the purposes of reducing the random error component is (eq 32) Neff=13 or greater. In this example, we could be averaging over as many as N=26 exposures, but this will be dependent on the specific resist and resist development sequence. Furthermore even though the exposure dose was set at the production dose (4*Eo) the dose at the wafer was sub-Eo (less than Eo) because it is equal to (1-R)*4*Eo=0.08*Eo or 8% of Eo. We have described this embodiment with respect to a partially reflecting reticle. The considerations are similar if the overlay reticle is absorbing, as it would be for overlay groups made entirely as an attenuating phase shift mask See The Attenuated Phase Shift Mask, B. Lin instead of reflecting; all that is required is a reticle with a decreased optical transmission from normal. To be useful, the reticle typically needs an optical transmission (1-R for a reflective mechanism) of <50% of normal or nominal.

Reticle Plate

A portion of the reticle plate for the preferred embodiment is shown in FIG. 21A. The preferred embodiment makes no strict requirements on the size of the reticle plate, the shape of the overlay target patterns or the types of materials used available, some are shown in U.S. Pat. No. 6,079,256, supra; Matching Management of Multiple Wafer Steppers Using a Stable Standard and a Matching Simulator, supra; Automated Electrical Measurements of Registration Errors in Step and Repeat Optical Lithography Systems, supra; U.S. Pat. No. 5,757,507, supra; U.S. Pat. No. 6,143,621, supra. The preferred embodiment will work with any stepper or scanner system using any type of overlay targets. The accuracy of the measurement technique does depend on the overlay sampling density, and this should be considered. Heretofore, we have considered the reticle creating the overlay patterns as perfect. In practice errors in the reticle manufacture can be taken into account by first measuring the position of all the individual structures in all of the overlay groups using an absolute metrology tool such as the Nikon 5I. See Measuring System XY-5i, supra or Leica LMS IPRO; Leica LMS IPRO Brochure, supra. Next, in formulating equations 6-9, this reticle error (divided by the projection imaging tool demagnification, M) is explicitly written out on the right hand side and then subtracted from the resulting overlay measurements on the left hand side of the equations (thereby canceling out on the right hand side). The result is equations 6-9 as they are written above but with a correction applied to the overlay measurements appearing on the left hand side. The solution and further interpretation then proceeds word for word as before.

Further Embodiments

Figure 42:
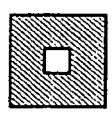
FIG. 42 details the inner box reticle pattern of FIG. 41.
Figure 43:
FIG. 43 details the outer box reticle pattern of FIG. 41.
Figure 41:
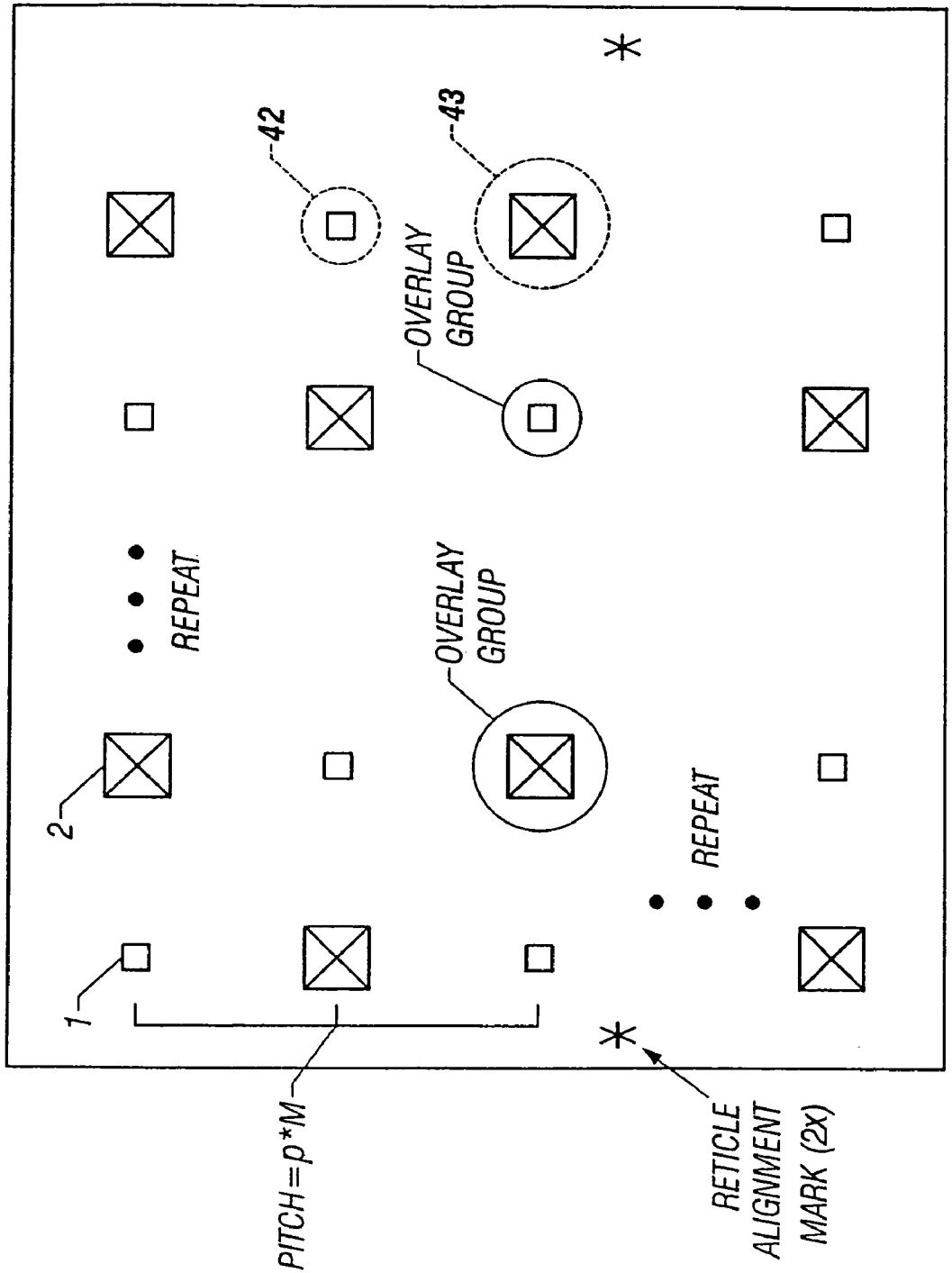
FIG. 41 shows an alternate overlay reticle schematic with alternating inner and outer box structures.

Instead of the reticle of FIG. 21A, this technique could be carried out with other reticle layouts, for example the reticle layout of FIG. 41. It consists of an Mx X My array of alternating inner box labeled 1 in FIG. 41 and shown in detail in FIG. 42, and outer box labeled 2 in FIG. 41 and shown detail in FIG. 43, on regular pitch p*M. Inner box 1 and outer box 2 form are complementary to one another and so form a completed alignment attribute when overlaid on one another. So there is now only one overlay feature within each overlay group as opposed to the three overlay features per overlay group of FIG. 21A. A difference now is that the wafer stage displacements required to produce an interlocking pattern, such as shown in FIG. 26 are odd integer multiples of the pitch, p illustrated in FIG. 41. Put differently, the wafer stepping distance in X is set by the distance between the leftmost box in the row of a projected field and the furthest complementary box on the right edge of the projected field. An inner box is complimentary to an outer box and vice-versa. The distance between fields in the Y direction is similarly determined. The pitch of inner and outer box patterns on the reticle, see FIG. 41, is p*M where M is the reduction magnification ratio of the projection lithography tool (typically 4 or 5), and p is the pitch of the features as projected onto the wafer.

Figure 8B:
FIG. 8B shows outer box 2 on the reticle, M=4.
Figure 45:
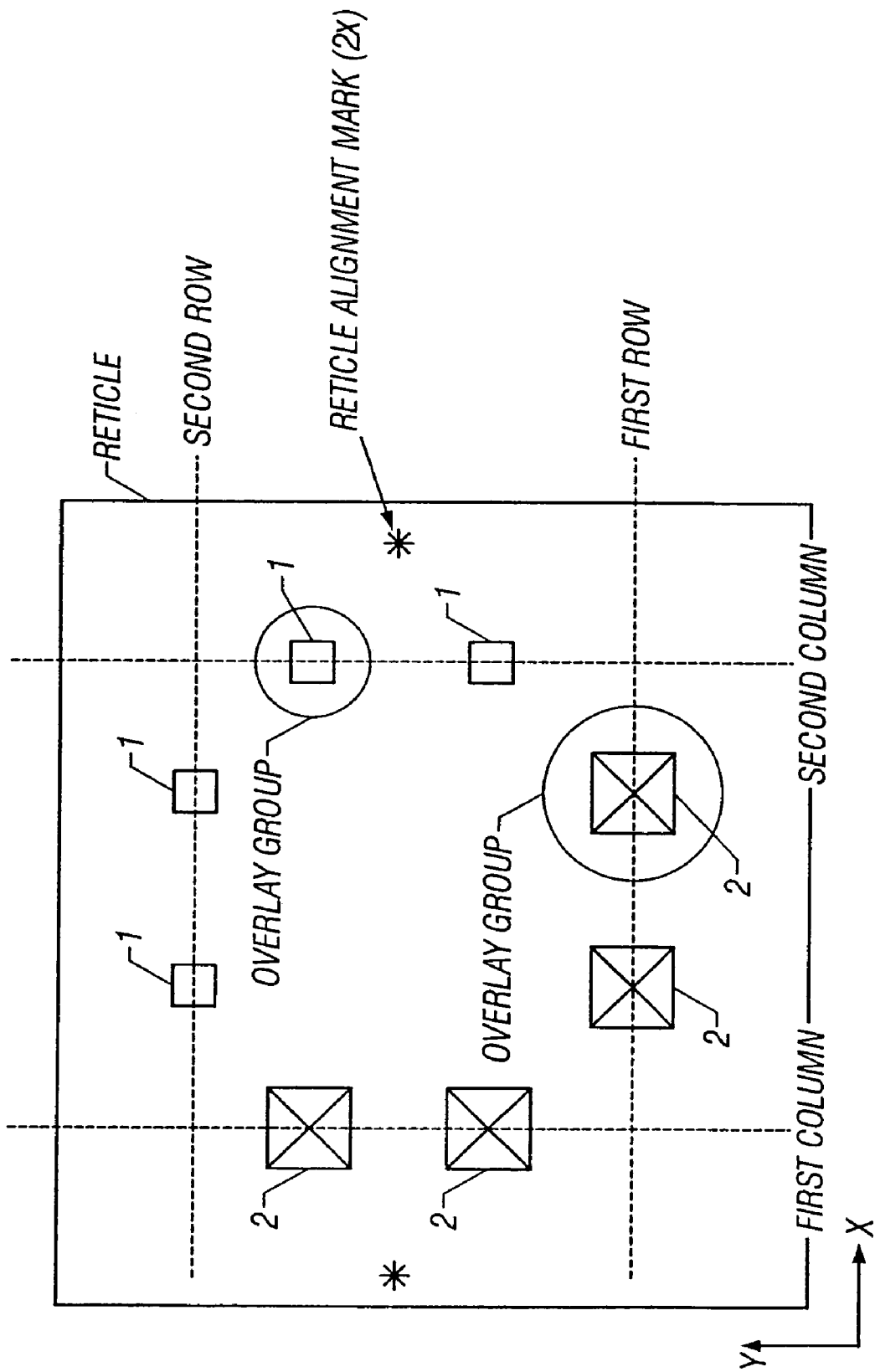
FIG. 45 shows a minimal reticle arrangement for accomplishing the method of this invention.

A simple reticle with which this technique can be carried out is illustrated in FIG. 45. It consists of two outer boxes (2) set along the left edge (first column) of the reticle and two inner boxes (1) set along the right edge (second column) with each inner box lying along the same row (same nominal y position) as an outer box along the left edge. The inner (1) and outer (2) boxes form a complementary pair of alignment attributes so that overlapping them forms a completed alignment attribute. FIG. 8B shows one form for the outer box (2) on the reticle while FIG. 10B shows one form for the inner box (1), and the completed alignment attribute as exposed on an M=4 (4:1 reduction magnification system) is shown in FIG. 12B.

Figure 12B:
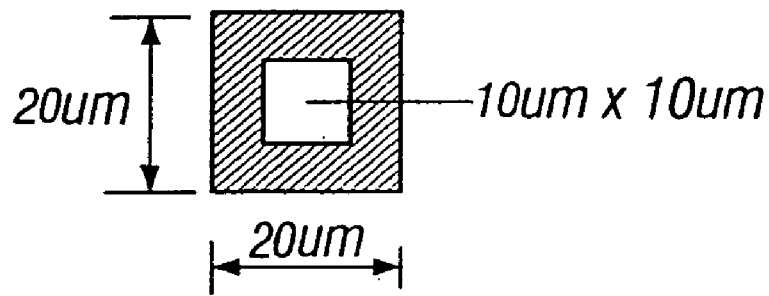
FIG. 12B shows a completed alignment attribute.
Figure 13:
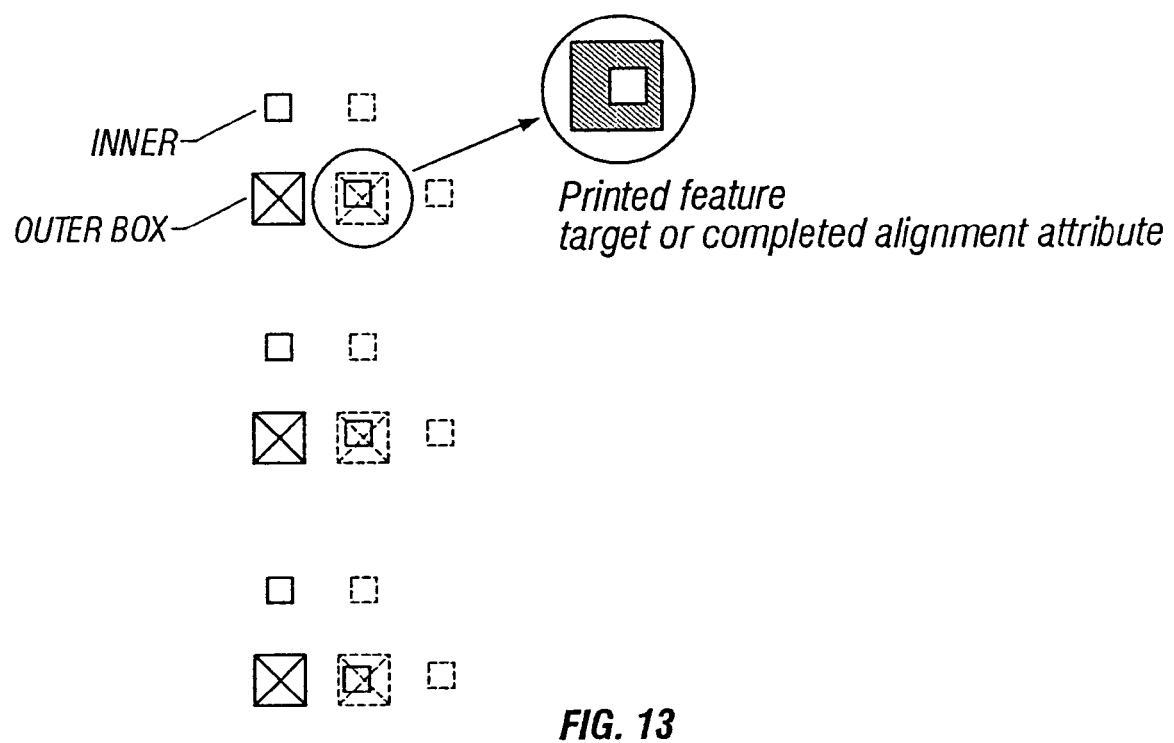
FIG. 13 shows overlay target patterns in the x-direction creating interlocking columns.

In FIG. 12B, the dark areas are unexposed resist so that in positive resist after the resist development process the dark area would correspond to remaining photoresist on the wafer while the white area would have no photoresist. In addition to the alignment attributes of the first and second column, there are 2 additional outer boxes (2) disposed along the bottom edge (first row) of the reticle. This first row is also located below, or in the negative y direction from the inner and outer boxes located in the first and second column and furthermore, the outer boxes in the first row are located at x positions in between the first and second columns and not on either of the first and second columns. This is so that the boxes in the first and second columns and the first row overlap with at most 1 other field when this reticle is exposed in an interlocking field stepping pattern. Along a second row which is above, or in the positive y direction from any of the before mentioned inner or outer boxes are two inner boxes (1) that are in the same columns or same x positions as the two outer boxes (2) along the first row. This pattern is minimal for the purposes of this invention in that only two interlocking exposures along each edge of a field can occur and there are no other redundant features.

Heretofore, we have assumed that the intra-field errors, (dxf, dyf)(a,b), are constant or do not change from exposure field to exposure field. This is true if the projected field results from an optical stepper or an optical scanner that is run with the stage scanning motion turned off (static mode). In these cases, we may safely assume that the intra-field errors will be constant from exposure to exposure. If the intrafield error is changing from field to field, as we would expect it to in the case of an optical scanner, then we can scan the same field multiple times so as to reduce the effect of the non-repeatable part of the intra-field error. For this, the reduced transmission reticle discussed above is useful.

Figure 2:
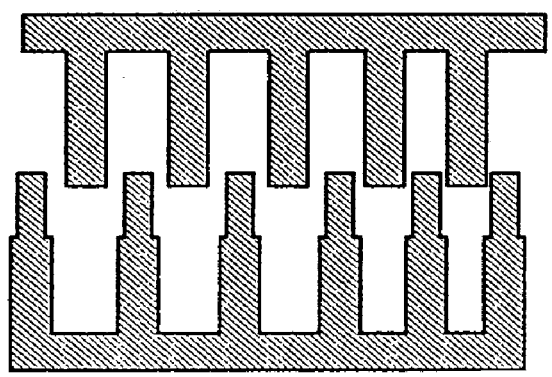
FIG. 2 shows typical optical verniers.
Figure 3:
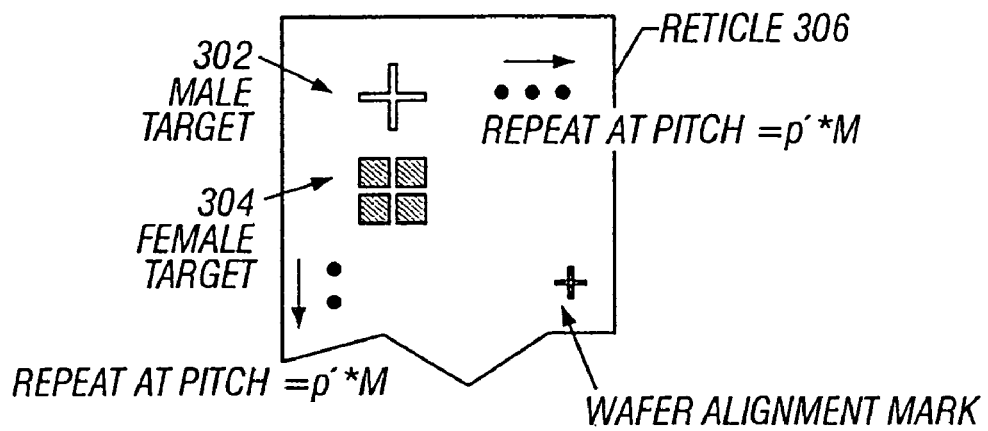
FIG. 3 shows a reticle in example by prior art.
Figure 4:
FIG. 4 shows overlapped male and female target pairs.
Figure 5:
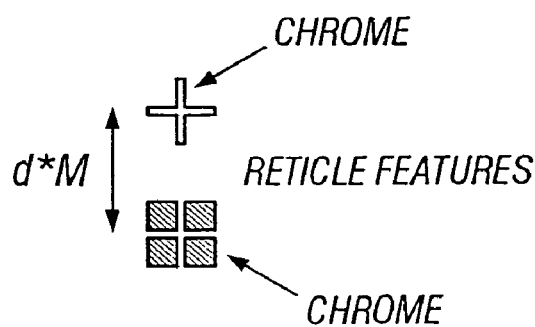
FIG. 5 shows details of the reticle of FIG. 3.
Figure 6:
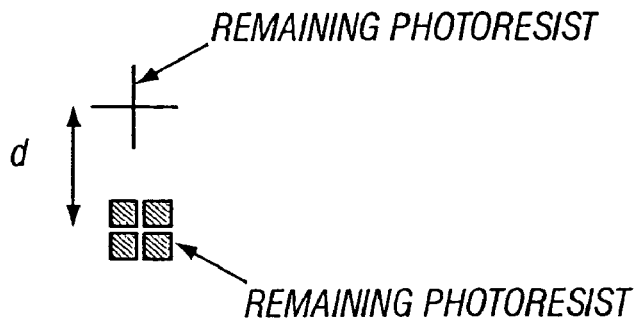
FIG. 6 shows Features of FIG. 5 in developed positive photoresist.
Figure 7:
FIG. 7 shows a schematic of outer box 2 of FIG. 11.

The method of the present invention has been mainly described with respect to alignment attributes that are in the form of a box in box or frame in frame pattern as shown in FIG. 1. Other alignment attributes such as gratings (See U.S. Pat. No. 6,079,256, supra, FIG. 1b), wafer alignment marks (See Matching Management of Multiple Wafer Steppers Using a Stable Standard and a Matching Simulator, supra), van der Pauw resistors (See Automated Electrical Measurements of Registration Errors in Step and Repeat Optical Lithography Systems, supra), vernier pairs (See U.S. Pat. No. 5,757,507, supra), capacitor structures (See U.S. Pat. No. 6,143,621, supra), and verniers as shown in FIG. 2, could be used instead; in general, any alignment attribute that can be used by an overlay metrology tool for measuring offsets can be utilized by the methods of the present invention.

The overlay metrology tool utilized by the present technique is typically a conventional optical overlay tool such as those manufactured by KLA-Tencor (See KLA 5105 Overlay Brochure, supra; KLA 5200 Overlay Brochure, supra) or Bio-Rad Semiconductor Systems. See Quaestor Q7 Brochure, Bio-rad Semiconductor Systems, supra. Other optical overlay tools that can be used by the present invention include those described in U.S. Pat. No. 5,438,413, supra. In addition, some steppers or scanners (See Matching Management of Multiple Wafer Steppers Using a Stable Standard and a Matching Simulator, supra) can utilize their wafer alignment systems and wafer stages to function as overlay tools. However, in this role we would limit the total size of the alignment attribute (consisting of 2 wafer alignment marks) to a distance over which the wafer stage would be as accurate as a conventional optical overlay tool. This distance is typically <0.5 mm. When electrical alignment attributes are used for overlay (See Matching Management of Multiple Wafer Steppers Using a Stable Standard and a Matching Simulator, supra; Automated Electrical Measurements of Registration Errors in Step and Repeat Optical Lithography Systems, supra; U.S. Pat. No. 6,143,621, supra), the overlay metrology tool as utilized by this invention would correspond to the electrical equipment utilized for making the corresponding measurement.

The present invention has been mainly described with respect to its application on the projection imaging tools (steppers See Direct-referencing Automatic Two-points Reticle-to-Wafer Alignment Using a Projection Column Servo System, supra; New o.54 Aperature I-Line Wafer Stepper With Field by Field Leveling Combined with Global Alignment, supra; U.S. Pat. No. 4,861,146 Variable Focal Lens Device, supra), and scanners (See Micrascan(TM) III Performance of a Third Generation, Catadioptric Step and Scan Lithographic Tool, supra; ArF Step And Scan Exposure System For 0.15 Micron and 0.13 micron Technology Node, supra; 0.7 NA DUV Step and Scan System for 150 nm Imaging with Improved Overlay, supra) most commonly used in semiconductor manufacturing today. The methods of the present invention can be applied to other projection imaging tools such as contact or proximity printers (See Optical Lithography Thirty Years and Three Orders of Magnitude, supra) 2-dimensional scanners, (See Large Area Fine Line Patterning By Scanning Projection Lithography, supra; U.S. Pat. No. 5,285,236, supra; Optical Lithography Thirty Years and Three Orders of Magnitude, supra), and next generation lithography (ngl) systems such as XUV (See Development of XUV Projection Lithography at 60-80 nm, supra), SCALPEL, EUV (Extreme Ultra Violet), (See Reduction Imaging at 14 nm Using Multilayer-Coated Optics: Printing of Features Smaller than 0.1 Micron, J. Bjorkholm, et. al., Journal Vacuum Science and Technology, B8(6), 1509:1513, Nov/Dec 1990), x-ray imaging systems, IPL (Ion Projection Lithography), and EPL (electron projection lithography). See Mix-And-Match: A Necessary Choice, supra.

The reticle of the present technique is typically glass with openings defined in a chrome coating. This is common for projection lithography tools utilized in semiconductor manufacture. The form the reticle can take will be determined by the format required by the specific projection lithography tool on which the reticle is loaded.

The present technique has been mainly described with respect to the recording medium being positive photoresist. The present invention could equally well have used negative photoresist providing we make appropriate adjustment to the box in box structures on the reticle. In general, the recording medium is whatever is typically used on the lithographic projection tool we are measuring. Thus, on an EPL tool, an electron beam resist such as PMMA could be utilized as the recording medium.

So far, we have described the substrates on which the recording media is placed as wafers. This will be the case in semiconductor manufacture. The exact form of the substrate will be dictated by the projection lithography tool and its use in a specific manufacturing environment. Thus, in a flat panel manufacturing facility, the substrate on which the photoresist would be placed would be a glass plate or panel. A mask making tool would utilize a reticle as a substrate. Circuit boards or multi-chip module carriers are other possible substrates.

The present invention has been described above in terms of a presently preferred embodiment so that an understanding of the present invention can be conveyed. There are, however, many configurations for ownership interest award techniques not specifically described herein but with which the present invention is applicable. The present invention should therefore not be seen as limited to the particular embodiments described herein, but rather, it should be understood that the present invention has wide applicability with respect to ownership interest award techniques generally. All modifications, variations, or equivalent arrangements and implementations that are within the scope of the attached claims should therefore be considered within the scope of the invention.

We claim:

1. A reticle used for determining inter-field overlay error of a stage on a projection imaging tool, the reticle comprising:
   a first set of alignment attributes disposed along a first column;
   a second set of alignment attributes that are complementary to the first set of alignment attributes, the second set of alignment attributes disposed along a second column distinct from the first column, wherein the alignment attributes in the first and second sets are aligned in corresponding rows;
   a third set of alignment attributes distributed along a first row between the first and second column; and
   a fourth set of alignment attributes complementary to the third set of attributes, the fourth set of alignment attributes disposed in a second row distinct from the first row, wherein the alignment attributes in the third and fourth sets are aligned in corresponding columns, wherein the second and fourth alignment attributes are complementary to the first and third alignment attributes, respectively, in that exposure of the second and fourth alignment attributes interlock with a previous exposure of the first and third alignment attributes after the stage has been shifted in a desired direction relative to the reticle, wherein offset measurements of the exposed alignment attributes are used to determine a self referenced wafer stage overlay error map.

2. A reticle as defined in claim 1, wherein the reticle has reduced transmission.

3. A reticle as defined in claim 2, further comprising a partially reflecting dielectric coating.

4. A reticle as defined in claim 2, further comprising an attenuated phase shift mask.

5. An apparatus for determining inter-field overlay error of a stage on a reticle projection imaging tool, the apparatus comprising:
   means for producing a first set of alignment attributes disposed along a first column;
   means for producing a second set of alignment attributes that are complementary to the first set of alignment attributes, the second set of alignment attributes disposed along a second column distinct from the first column, wherein the alignment attributes in the first and second sets are aligned in corresponding rows;
   means for producing a third set of alignment attributes distributed along a first row between the first and second column; and
   means for producing a fourth set of alignment attributes complementary to the third set of attributes, the fourth set of alignment attributes disposed in a second row distinct from the first row, wherein the alignment attributes in the third and fourth sets are aligned in corresponding columns, wherein the second and fourth alignment attributes are complementary to the first and third alignment attributes, respectively, in that an exposure of the second and fourth alignment attributes interlock with a previous exposure of the first and third alignment attributes after the stage has been shifted in a desired direction relative to the reticle, wherein offset measurements of the exposed alignment attributes are used to determine a self referenced wafer stage overlay error map.

* * * * *